United States Patent
Kurokawa

(10) Patent No.: US 9,455,287 B2
(45) Date of Patent: Sep. 27, 2016

(54) IMAGING DEVICE, MONITORING DEVICE, AND ELECTRONIC APPLIANCE

(71) Applicant: Semiconductor Energy Laboratory Co., Ltd., Atsugi-shi, Kanagawa-ken (JP)

(72) Inventor: Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/749,355

(22) Filed: Jun. 24, 2015

(65) Prior Publication Data

US 2015/0380451 A1    Dec. 31, 2015

(30) Foreign Application Priority Data

Jun. 25, 2014    (JP) .................. 2014-129826

(51) Int. Cl.
*H01L 27/146*    (2006.01)
*H01L 27/144*    (2006.01)
(Continued)

(52) U.S. Cl.
CPC ... *H01L 27/14616* (2013.01); *H01L 27/14632* (2013.01); *H01L 27/14636* (2013.01);
(Continued)

(58) Field of Classification Search
CPC ......... G11C 5/06; G11C 7/00; G11C 7/1006; G11C 11/405; G11C 11/4072; G11C 11/401; H03K 19/1778; H01L 27/14856
USPC .......... 365/149; 348/311, 322; 257/222, 233
See application file for complete search history.

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

EP    1737044 A    12/2006
EP    2226847 A    9/2010
(Continued)

OTHER PUBLICATIONS

Ohmaru.T et al., 25.3μW at 60fps 240×160-Pixel Vision Sensor for Motion Capturing with In-Pixel Non-Volatile Analog Memory Using Crystalline Oxide Semiconductor FET, ISSCC 2015 (Digest of Technical Papers. IEEE International Solid-State Circuits Conference), Feb. 23, 2015, pp. 118-120.

(Continued)

*Primary Examiner* — Whitney T Moore
*Assistant Examiner* — Changhyun Yi
(74) *Attorney, Agent, or Firm* — Fish & Richardson P.C.

(57) ABSTRACT

A highly accurate imaging device or a highly accurate imaging device capable of detecting differences is provided. A configuration including a circuit in which variation in threshold voltage among amplifier transistors of pixels is corrected is employed. The configuration reduces variation in difference data due to variation in the threshold voltage among the amplifier transistors of the pixels to obtain highly accurate imaging data. Furthermore, charge corresponding to difference data between imaging data in an initial frame and imaging data in a current frame is accumulated in pixels and the difference data is read from each pixel, whereby highly accurate difference data is obtained when whether there is a difference between the initial frame and the current frame is determined.

18 Claims, 22 Drawing Sheets

(51) Int. Cl.
  *H04N 7/18* (2006.01)
  *H04N 5/378* (2011.01)
  *H04N 5/335* (2011.01)
  *H04N 5/232* (2006.01)

(52) U.S. Cl.
  CPC .... *H01L27/14621* (2013.01); *H01L 27/14643* (2013.01); *H04N 5/23254* (2013.01); *H04N 5/335* (2013.01); *H04N 5/378* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,046,282 B1 | 5/2006 | Zhang et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,424,764 B2 | 4/2013 | Tanaka et al. |
| 8,836,626 B2 | 9/2014 | Ikeda |
| 9,111,824 B2 | 8/2015 | Ikeda |
| 9,131,171 B2 | 9/2015 | Aoki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0056252 A1* | 3/2012 | Aoki .................. G09G 3/3648 257/292 |
| 2013/0016035 A1* | 1/2013 | Ikeda ................ H01L 27/14601 345/92 |
| 2015/0332568 A1 | 11/2015 | Kurokawa |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Aoki.T et al., "Electronic Global Shutter CMOS Image Sensor Using Oxide Semiconductor FET With Extremely Low Off-State Current", 2011 Symposium on VLSI Technology : Digest of Technical Papers, 2011, pp. 174-175.

Kato.K et al., "Evaluation of Off-State Current Characteristics of Transistor Using Oxide Semiconductor Material, Indium.Gallium. Zinc Oxide", Jpn. J Appl. Phys. (Japanese Journal of Applied Physics) , 2012, vol. 51, pp. 021201-1-021201-7.

Asakuma.N. et al., "Crystallization and Reduction of SOL-GEL-Derived Zinc Oxide Films by Irradiation With Ultraviolet Lamp", Journal of SOL-GEL Science and Technology, 2003, vol. 26, pp. 181-184.

(56) References Cited

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions of Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID DIgest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase""Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG—Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display of Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn]at Temperatures Over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

(56) References Cited

OTHER PUBLICATIONS

Nakamura.M, "Synthesis of Homolgous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White TANDEM OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn—Oxide TFTS With a Novel Passivation Layer", SID Digest '09 : SID International Symposium Digest of Technical Papers, May 31, 2009, pp. 284-287.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "Development of Driver-Integrated Panel Using Amorphous In—Ga—Zn—Oxide TFT", SID Digest '09 : SID International Symposium Digest of Technical Papers, May 31, 2009, pp. 184-187.
Osada.T et al., "Development of Driver-Integrated Panel using Amorphous In—Ga—Zn—Oxide TFT", AM-FPD '09 Digest of Technical Papers, Jul. 1, 2009, pp. 33-36.
Park.J et al., "Amorphous Indium—Gallium—Zinc Oxide TFTS and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn—Oxide TFTS", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

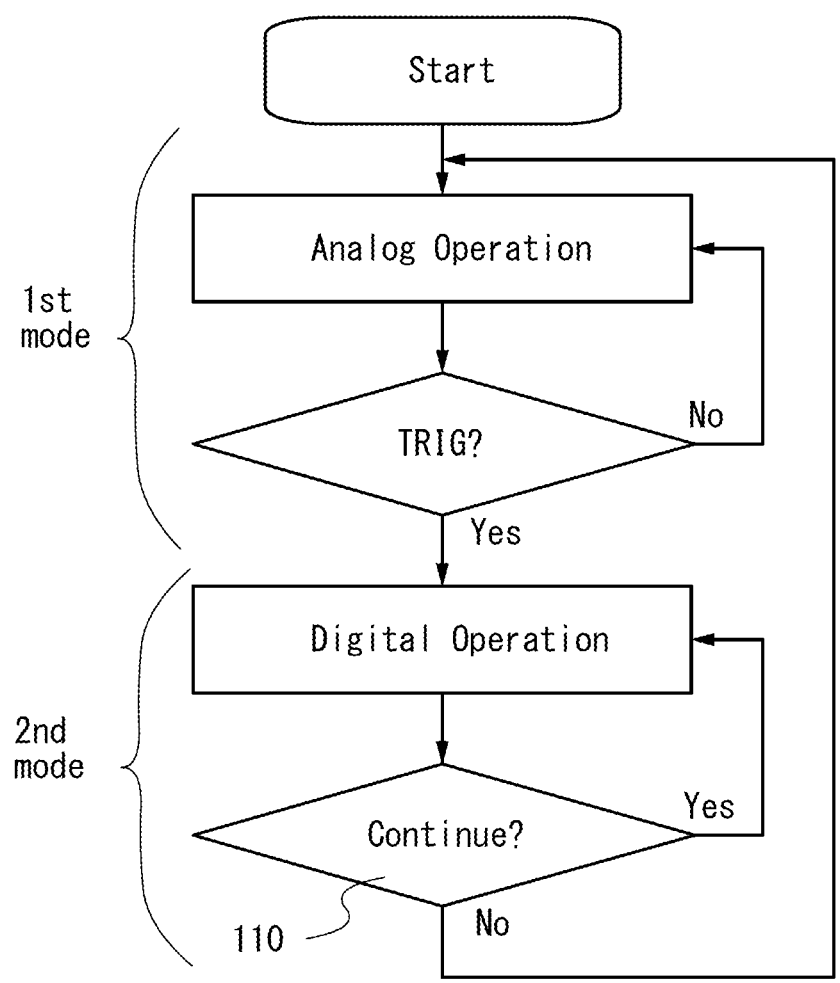

FIG. 7A1
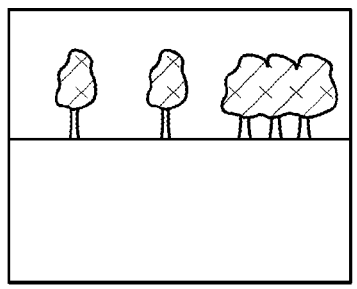
1st Imaging Data
FIG. 7A2
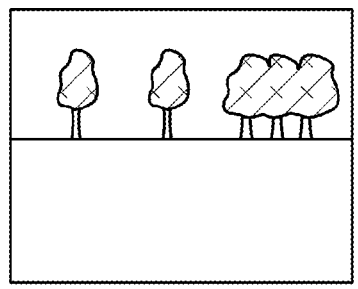
2nd Imaging Data
FIG. 7B1
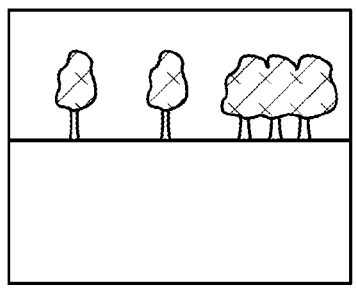
1st Imaging Data
FIG. 7B2
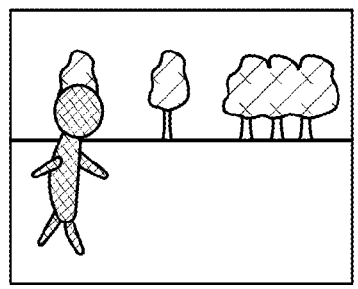
2nd Imaging Data
FIG. 7C
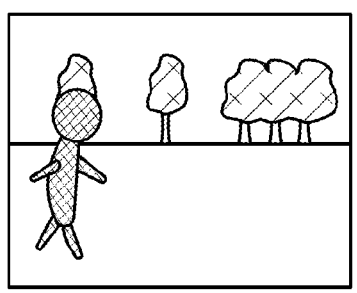
3rd Imaging Data

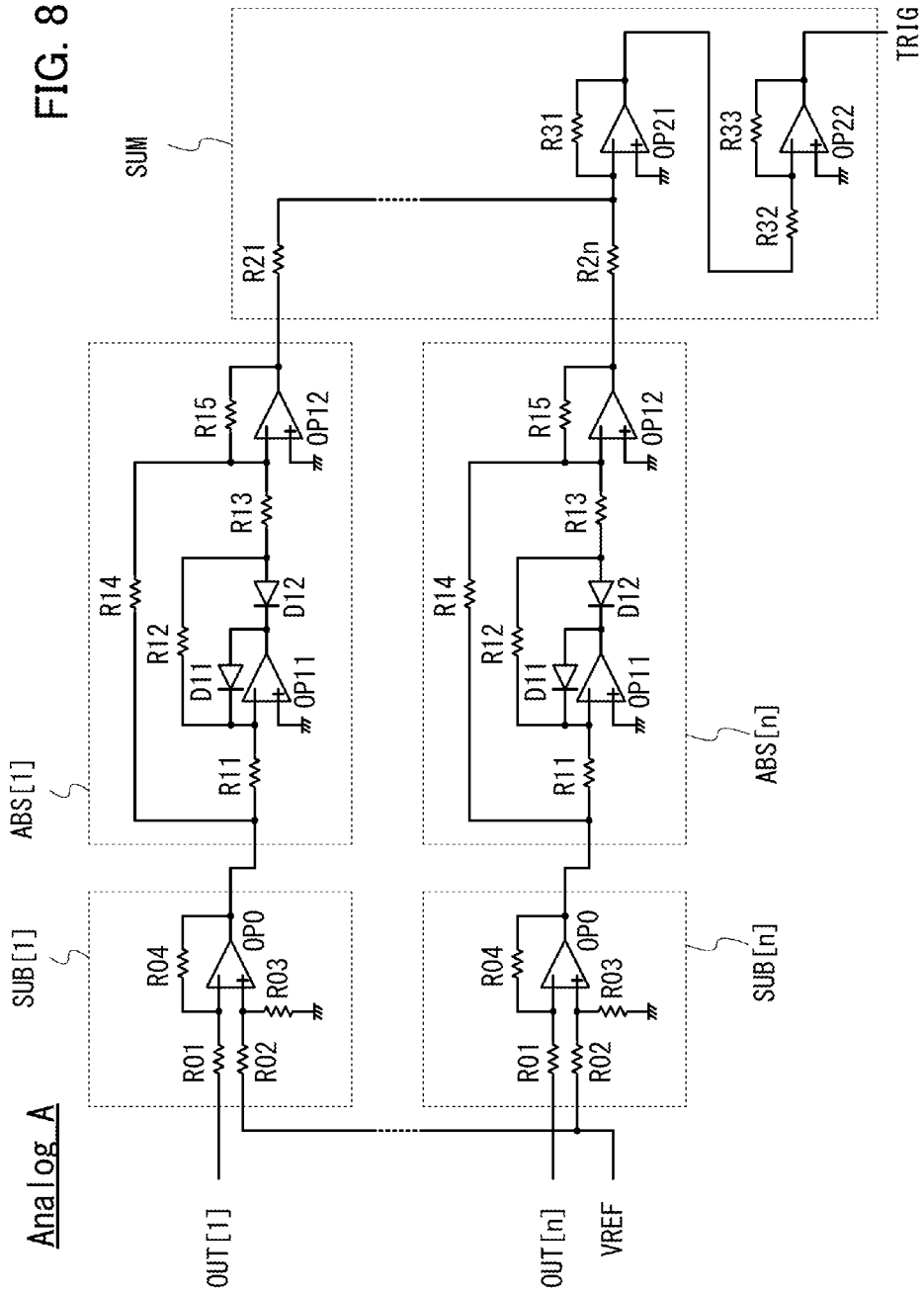

IMAGING DEVICE, MONITORING DEVICE, AND ELECTRONIC APPLIANCE

BACKGROUND OF THE INVENTION

1. Field of the Invention

One embodiment of the present invention relates to an imaging device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

2. Description of the Related Art

Imaging devices are normally incorporated in mobile phones, and have come into widespread use (e.g., Patent Document 1). In particular, CMOS imaging sensors have advantages of low price, high resolution, low power consumption, and the like as compared with CCD image sensors. A CMOS image sensor accounts for the most part of an imaging device.

PATENT DOCUMENT

[Patent Document 1] U.S. Pat. No. 7,046,282

SUMMARY OF THE INVENTION

An object of one embodiment of the present invention is to provide a novel imaging device or the like.

Another object of one embodiment of the present invention is to provide an imaging device or the like having a novel structure capable of obtaining imaging data with high accuracy. Another object of one embodiment of the present invention is to provide an imaging device or the like having a novel structure capable of obtaining difference data with high accuracy.

Note that the objects of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention is to solve at least one of the aforementioned objects and the other objects.

One embodiment of the present invention is an imaging device including a pixel. The pixel includes a photodiode, a first transistor, a second transistor, a first capacitor, a second capacitor, a first wiring, a second wiring, and a third wiring. One electrode of the photodiode is electrically connected to the first wiring. The photodiode is capable of generating photoelectric converted signal charge. The first wiring is capable of supplying a low potential. One electrode of the first capacitor is electrically connected to the other electrode of the photodiode. The other electrode of the first capacitor is electrically connected to a gate of the first transistor. One electrode of the second capacitor is electrically connected to the gate of the first transistor. The other electrode of the second capacitor is electrically connected to one of a source and a drain of the first transistor. The other of the source and the drain of the first transistor is electrically connected to the second wiring. The second wiring is capable of supplying a high potential. One of a source and a drain of the second transistor is electrically connected to the gate of the first transistor. The other of the source and the drain of the second transistor is electrically connected to the third wiring. The third wiring is capable of supplying a high potential.

In one embodiment of the present invention, it is preferable that the imaging device include a third transistor; one of a source and a drain of the third transistor be electrically connected to the other electrode of the photodiode; the other of the source and the drain of the third transistor be electrically connected to the one electrode of the first capacitor; and the third transistor be capable of supplying the signal charge to the one electrode of the first capacitor.

In one embodiment of the present invention, it is preferable that the imaging device include a fourth transistor and a fourth wiring; one of a source and a drain of the fourth transistor be electrically connected to the fourth wiring; the other of the source and the drain of the fourth transistor be electrically connected to the one electrode of the first capacitor; the fourth wiring be capable of supplying a high potential; and the fourth transistor be capable of supplying a potential of the fourth wiring to the one electrode of the first capacitor.

In one embodiment of the present invention, the imaging device has the following structure the first to fourth transistors each include a semiconductor layer; and the semiconductor layer includes an oxide semiconductor.

In one embodiment of the present invention, the imaging device has preferably the following structure: the second transistor is capable of making the second capacitor have a threshold voltage of the first transistor by supplying a potential of the third wiring to the one electrode of the second capacitor; and the first capacitor is capable of bringing the other electrode of the first capacitor into an electrically floating state in a state where the threshold voltage is retained in the second capacitor, and capable of changing a potential of the gate of the first transistor when a potential of the one electrode of the first capacitor is changed in accordance with the signal charge.

One embodiment of the present invention is an imaging device including a pixel. The pixel includes a photodiode, a first transistor, a second transistor, a third transistor, a first capacitor, a second capacitor, a third capacitor, a first wiring, a second wiring, a third wiring, and a fourth wiring. One electrode of the photodiode is electrically connected to the first wiring. The photodiode is capable of generating photoelectric converted signal charge. The first wiring is capable of supplying a low potential. One electrode of the first capacitor is electrically connected to the other electrode of the photodiode. The other electrode of the first capacitor is electrically connected to one electrode of the second capacitor. One of a source and a drain of the first transistor is electrically connected to the one electrode of the second capacitor. The other of the source and the drain of the first transistor is electrically connected to the second wiring. The second wiring is capable of supplying a high potential or a low potential. The other electrode of the second capacitor is electrically connected to a gate of the second transistor. One electrode of the third capacitor is electrically connected to the gate of the second transistor. The other electrode of the third capacitor is electrically connected to one of a source and a drain of the second transistor. The other of the source and the drain of the second transistor is electrically connected to the third wiring. The third wiring is capable of supplying a high potential.

In one embodiment of the present invention, it is preferable that the imaging device include a fourth transistor; one of a source and a drain of the fourth transistor be electrically connected to the other electrode of the photodiode; the other of the source and the drain of the fourth transistor be electrically connected to the one electrode of the first capacitor; and the fourth transistor be capable of supplying the signal charge to the one electrode of the first capacitor.

In one embodiment of the present invention, it is preferable that the imaging device be include a fifth transistor and a fifth wiring; one of a source and a drain of the fifth transistor be electrically connected to the fourth wiring; the other of the source and the drain of the fifth transistor be electrically connected to the one electrode of the first capacitor; the fifth wiring be capable of supplying a high potential; and the fifth transistor be capable of supplying a potential of the fifth wiring to the one electrode of the first capacitor.

In one embodiment of the present invention, the imaging device preferably the following structure: the first to fifth transistors each include a semiconductor layer; and the semiconductor layer includes an oxide semiconductor.

In one embodiment of the present invention, the imaging device preferably has the following structure: the third transistor is capable of making the third capacitor have a threshold voltage of the second transistor by supplying a potential of the fourth wiring to the one electrode of the third capacitor; the first capacitor is capable of bringing the other electrode of the first capacitor into an electrically floating state and capable of changing a potential of the other electrode of the first capacitor when a potential of the one electrode of the first capacitor is changed in accordance with the signal charge; and the second capacitor is capable of bringing the other electrode of the second capacitor into an electrically floating state in a state where the threshold voltage is retained in the third capacitor, and capable of changing a potential of the gate of the second transistor when a potential of the one electrode of the second capacitor is changed.

Note that other embodiments of the present invention will be described in the following embodiments with reference to the drawings.

According to one embodiment of the present invention, an imaging device or the like having a novel structure can be provided.

According to one embodiment of the present invention, an imaging device or the like having a novel structure capable of obtaining imaging data with high accuracy can be provided. According to one embodiment of the present invention, an imaging device or the like having a novel structure capable of obtaining difference data with high accuracy can be provided.

Note that the effects of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention is to have at least one of the aforementioned effects and the other effects. Accordingly, one embodiment of the present invention does not have the aforementioned effects in some cases.

BRIEF DESCRIPTION OF THE DRAWINGS

FIG. 6 is a flow chart for describing one embodiment of the present invention.

FIGS. 7A1, 7A2, 7B1, 7B2, and 7C are schematic views for describing one embodiment of the present invention.

FIG. 8 is a circuit diagram for describing one embodiment of the present invention.

DETAILED DESCRIPTION OF THE INVENTION

Figure 1A:
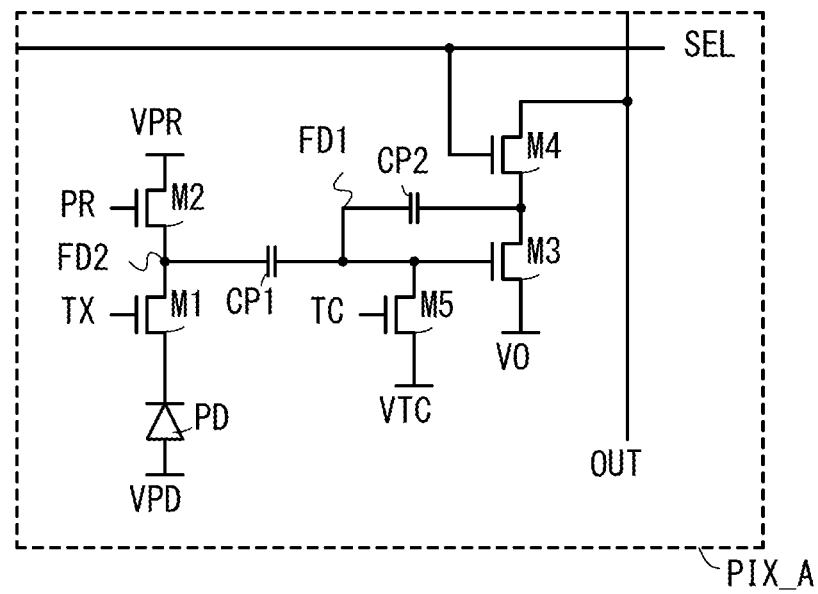
FIGS. 1A and 1B are a circuit diagram and a timing chart for describing one embodiment of the present invention.

Embodiments will be described below with reference to drawings. The embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings. For example, the following can be included: variation in signal, voltage, or current due to noise or difference in timing.

In this specification and the like, a transistor is an element having at least three terminals: a gate, a drain, and a source. The transistor includes a channel region between the drain (a drain terminal, a drain region, or a drain electrode) and the source (a source terminal, a source region, or a source electrode) and current can flow through the drain, the channel region, and the source.

Here, since the source and the drain of the transistor change depending on the structure, the operating condition, and the like of the transistor, it is difficult to define which is a source or a drain. Thus, a portion that functions as a source or a portion that functions as a drain is not referred to as a source or a drain in some cases. Instead, one of the source and the drain might be referred to as a first electrode, and the other of the source and the drain might be referred to as a second electrode.

Note that in this specification, ordinal numbers such as "first", "second", and "third" are used in order to avoid confusion among components, and thus do not limit the number of the components.

In this specification, the expression "A and B are connected" means the case where A and B are electrically connected to each other in addition to the case where A and B are directly connected to each other. Here, the expression "A and B are electrically connected" means the case where electric signals can be transmitted and received between A and B when an object having any electric action exists between A and B.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X the source (or the first terminal or the like) of the transistor, the drain (or the second terminal or the like) of the transistor, and Y are electrically connected to each other in this order", "a source (or a first terminal or the like) of a transistor is electrically connected to X a drain (or a second terminal or the like) of the transistor is electrically connected to Y, and X the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and the expression is not limited to these examples. Here, X, Y, Z1, and Z2 each denote an object (e.g., a device, an element, a circuit, a wiring, an electrode, a terminal, a conductive film, and a layer).

Note that in this specification, terms for describing arrangement, such as "over" and "under", are used for convenience to describe the positional relation between components with reference to drawings. Further, the positional relation between components is changed as appropriate in accordance with a direction in which each component is described. Thus, the positional relation is not limited to that described with a term used in this specification and can be explained with another term as appropriate depending on the situation.

The positional relation of circuit blocks in a block diagram is specified for description. Even when a block diagram shows that different functions are achieved by different circuit blocks, one circuit block may be actually configured to achieve the different functions. Functions of circuit blocks in a diagram are specified for description, and even when a diagram shows one circuit block performing given processing, a plurality of circuit blocks may be actually provided to perform the processing.

In this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. The term "perpendicular" indicates that the angle formed between two straight lines is greater than or equal to 80° and less than or equal to 100°, and accordingly also includes the case where the angle is greater than or equal to 85° and less than or equal to 95°.

In this specification, trigonal and rhombohedral crystal systems are included in a hexagonal crystal system.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Embodiment 1

A configuration of a pixel included in an imaging device of one embodiment of the present invention is described with reference to FIGS. 1A and 1B.

In this specification and the like, an imaging device refers to any device that has an imaging function. Furthermore, an imaging device refers to a circuit that has an imaging function or the whole of a system that includes the circuit.

FIG. 1A is a circuit diagram illustrating a configuration of a pixel included in an imaging device of one embodiment of the present invention. A pixel PIX_A in FIG. 1A includes transistors M1 to M5, a capacitor CP1, a capacitor CP2, and a photodiode PD.

Potentials are supplied from power supply lines VPD, VPR, VTC, and VO to the transistors, the capacitors, and the photodiode illustrated in FIG. 1A. Furthermore, control signals are supplied from signal lines TX, PR, TC, and SEL to the elements, and imaging data of the pixel is output to a signal line OUT. Note that the power supply line is a wiring that has a function of transmitting a predetermined potential, and the signal line is a wiring that has a function of transmitting a predetermined control signal. Thus, the power supply lines and the signal lines may each be referred to as a wiring.

One electrode of the photodiode PD is connected to the power supply line VPD. The power supply line VPD may be referred to as a first wiring. The photodiode PD has a function of generating photoelectric-converted signal charge. The photodiode PD may be referred to as a photoelectric conversion element.

One electrode of the capacitor CP1 is connected to one of a source and a drain of the transistor M1. The other electrode of the capacitor CP1 is connected to a gate of the transistor M3. The capacitor CP1 may be referred to as a first capacitor. The transistor M3 may be referred to as a first transistor.

One electrode of the capacitor CP2 is connected to the gate of the transistor M3. The other electrode of the capacitor CP2 is connected to one of a source and a drain of the transistor M3.

The other of the source and the drain of the transistor M3 is connected to the power supply line VO. The power supply line VO may be referred to as a second wiring.

One of a source and a drain of the transistor M5 is connected to the gate of the transistor M3. The other of the source and the drain of the transistor M5 is connected to the power supply line VTC. A gate of the transistor M5 is connected to the signal line TC. The transistor M5 may be referred to as a second transistor. The power supply line VTC may be referred to as a third wiring.

The other of the source and the drain of the transistor M1 is connected to the other electrode of the photodiode PD. A gate of the transistor M1 is connected to the signal line TX. The transistor M1 may be referred to as a third transistor.

The transistor M1 has a function of supplying the signal charge generated in the photodiode PD to the one electrode of the capacitor CP1 by controlling electrical connection between the one electrode of the capacitor CP1 and the other electrode of the photodiode PD.

One of a source and a drain of the transistor M2 is connected to the power supply line VPR. The other of the source and the drain of the transistor M2 is connected to the one electrode of the capacitor CP1. A gate of the transistor M2 is connected to the signal line PR. The transistor M2 may be referred to as a fourth transistor. The transistor M2 has a function of supplying the potential of the power supply line VPR to the one electrode of the capacitor CP1. The power supply line VPR may be referred to as a fourth wiring.

One of a source and a drain of the transistor M4 is connected to the one of the source and the drain of the transistor M3. The other of the source and the drain of the transistor M4 is connected to the signal line OUT. A gate of the transistor M4 is connected to the signal line SEL. The transistor M4 has a function of selectively controlling a current flowing between the power supply line VO and the signal line OUT in response to a control signal of the signal line SEL.

As described below, the transistor M5 has a function of supplying the potential of the power supply line VTC to the one electrode of the capacitor CP2 in order that the capacitor CP2 retains the threshold voltage of the transistor M3. The capacitor CP1 is capable of bringing the other electrode of the capacitor CP1 into an electrically floating state while the threshold voltage is retained in the capacitor CP2, and is capable of changing the potential of the gate of the transistor M3 when the potential of the one electrode of the capacitor CP1 is changed in accordance with the signal charge generated in the photodiode PD.

Note that FIG. 1A may be referred to for connection relationships between the transistors, the capacitors, and the photodiode.

The numbers of the transistors M1 and the photodiodes PD in FIG. 1A may each be two or more. For example, a configuration of a pixel PIX_F in FIG. 17A may be employed, in which a photodiode PD_A and a photodiode PD_B are provided, a signal line TXA is connected to a gate of a transistor M1A, and a signal line TXB is connected to a gate of a transistor M1B. Alternatively, for example, a configuration of a pixel PIX_G in FIG. 17B may be employed, in which the photodiodes PD_A and PD_B and a photodiode PD_C are provided, the signal line TXA is connected to the gate of the transistor M1A, the signal line TXB is connected to the gate of the transistor M1B, and a signal line TXC is connected to a gate of a transistor M1C.

Figure 17A:
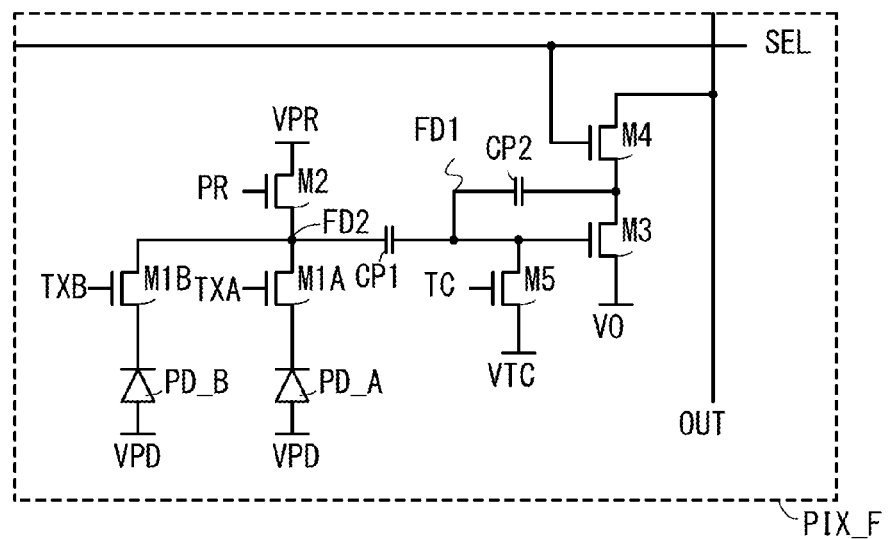
FIGS. 17A and 17B are each a circuit diagram for describing one embodiment of the present invention.
Figure 17B:
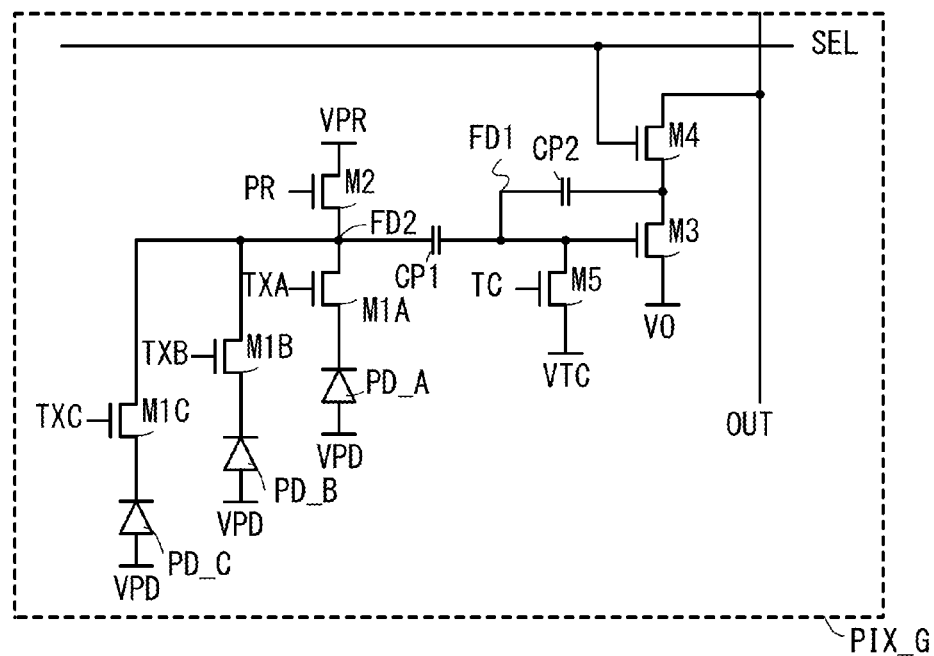
Figure 18A:
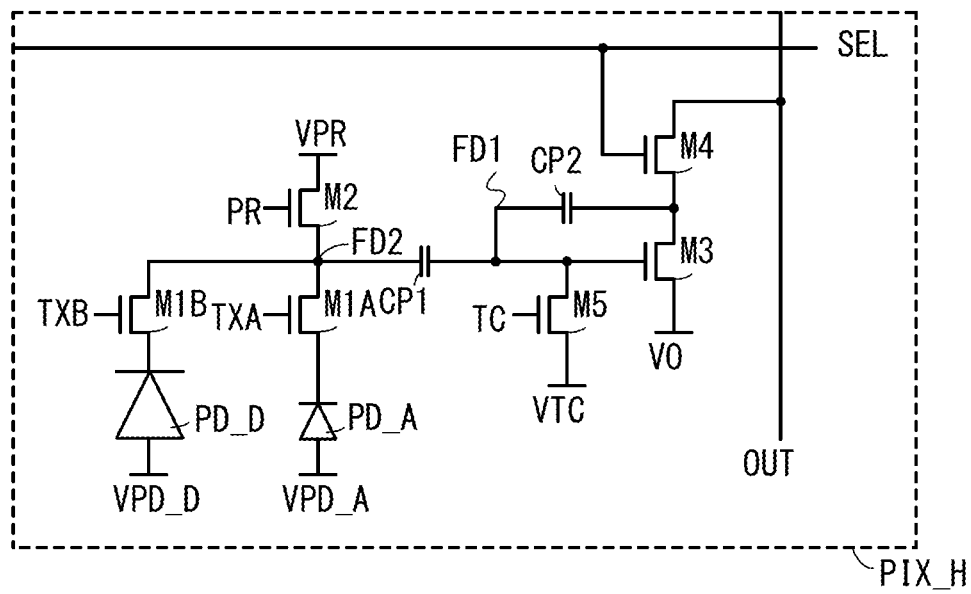
FIGS. 18A and 18B are each a circuit diagram for describing one embodiment of the present invention.
Figure 18B:
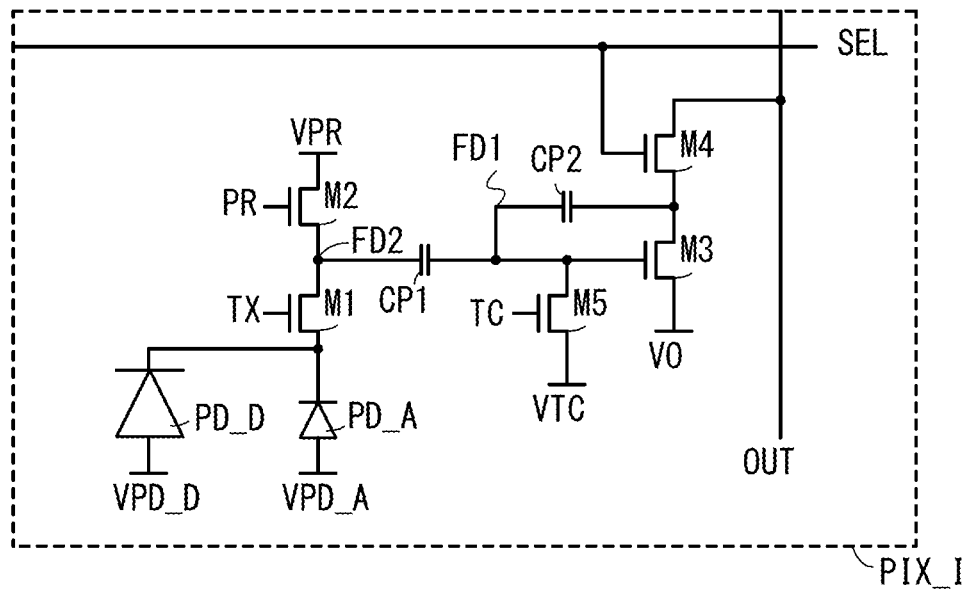

In the case where a plurality of photodiodes is provided as in FIGS. 17A and 17B, light receiving surface areas of the photodiodes may be different from each other. In this case, as in a pixel PIX_H in FIG. 18A, the photodiodes PD_A and PD_D which have different light-receiving surface areas may be provided for the transistors M1A and M1B, respectively. Note that the photodiode PD_A is connected to a power supply line VPD_A, and the photodiode PD_D is connected to a power supply line VPD_D. The potential of the power supply line VPD_A and the potential of the power supply line VPD_D may be either the same or different. Alternatively, as in a pixel PIX_I in FIG. 18B, the photodiodes PD_A and PD_D that have different light-receiving surface areas may be provided for one transistor M1. The structure of FIG. 18A or 18B with photodiodes having different spectral sensitivities makes it possible to perform imaging in a bright location and imaging in a dark location at the same time. Note that to obtain different spectral sensitivities of the photodiodes, the light-receiving surface areas of the photodiodes may be made different from each other, or different kinds of semiconductor materials may be provided on the light-receiving surfaces.

In FIG. 1A, a node connected to the gate of the transistor M3 is referred to as a node FD1. In addition, in FIG. 1A, a node connected to the one electrode of the capacitor CP2 is referred to as a node FD2. Charge corresponding to imaging data is accumulated in the nodes FD1 and FD2.

Owing to capacitive coupling of the capacitor CP1 and a combined capacitance of the capacitor CP2 and the gate capacitance of the transistor M3, the potential of the node FD1 changes in response to a change in the potential of the node FD2. Therefore, the capacitance value of the capacitor CP1 is preferably larger than the capacitance value of the combined capacitance of the capacitor CP2 and the gate capacitance of the transistor M3.

Figure 1B:
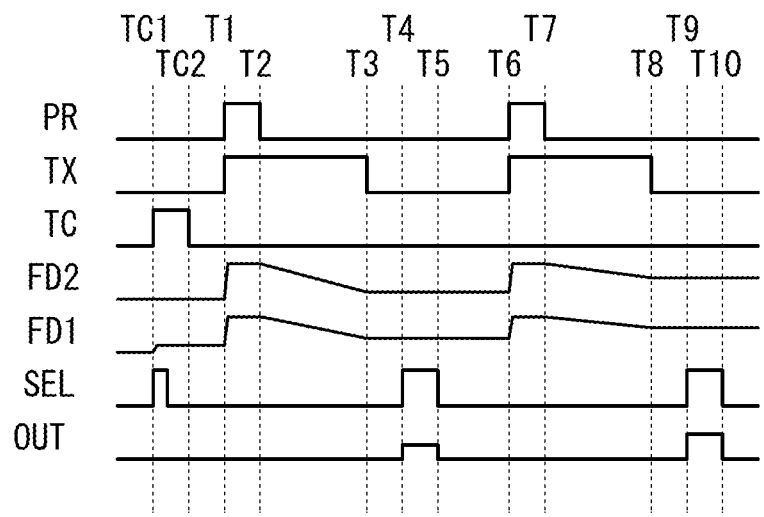

FIG. 1B is a timing chart showing operations of the pixel PIX_A in FIG. 1A. FIG. 1B shows operations for obtaining imaging data. Here, for example, the power supply line VPD is set at a low potential, the power supply line VPR is set at a high potential, the power supply line VTC is set at a high potential, and the power supply line VO is set at a high potential.

Figure 20A:
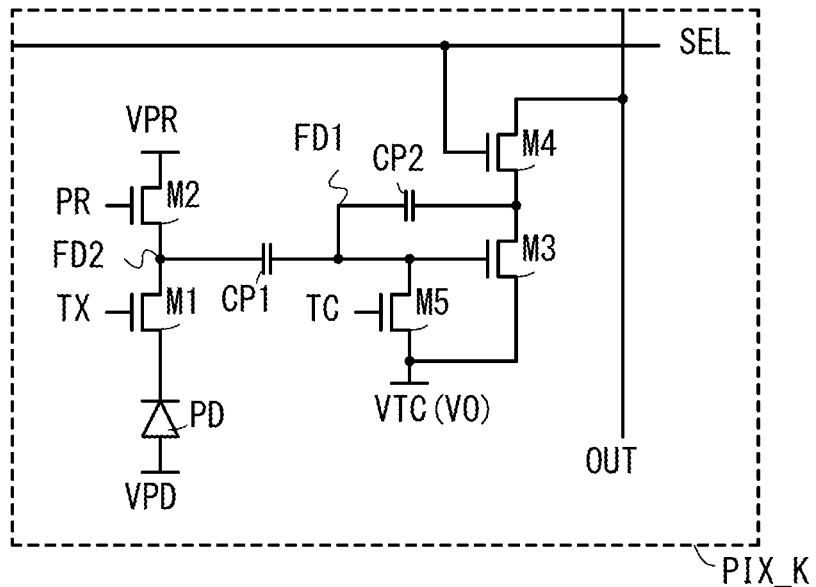
FIGS. 20A and 20B are each a circuit diagram for describing one embodiment of the present invention.
Figure 20B:
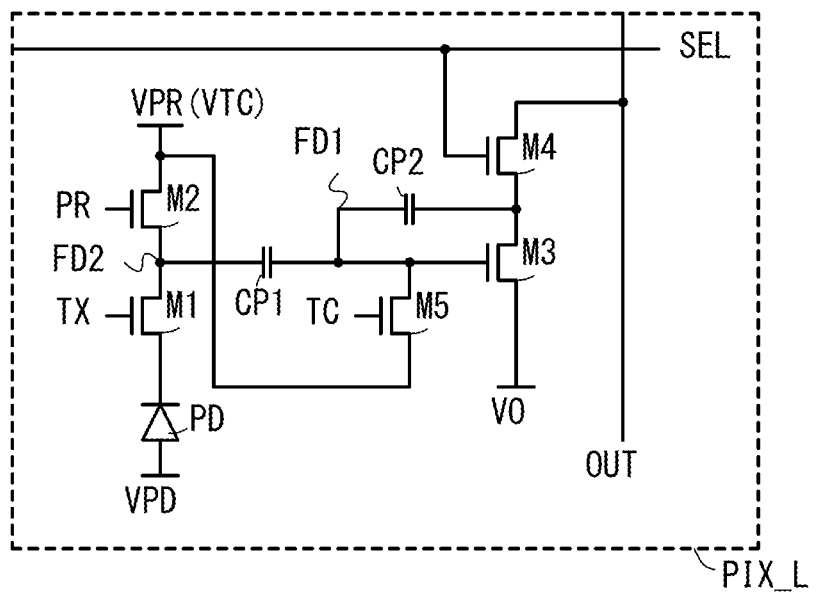
Figure 21A:
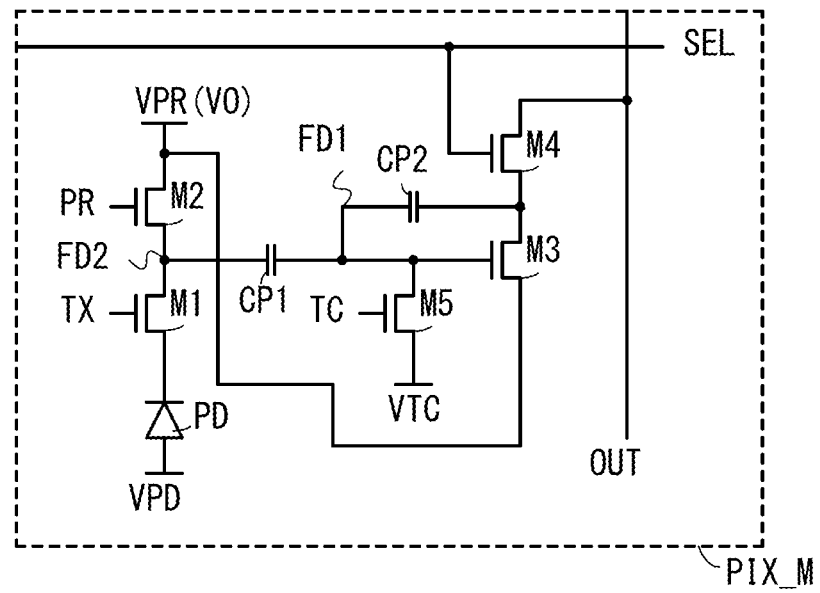
FIGS. 21A and 21B are each a circuit diagram for describing one embodiment of the present invention.
Figure 21B:
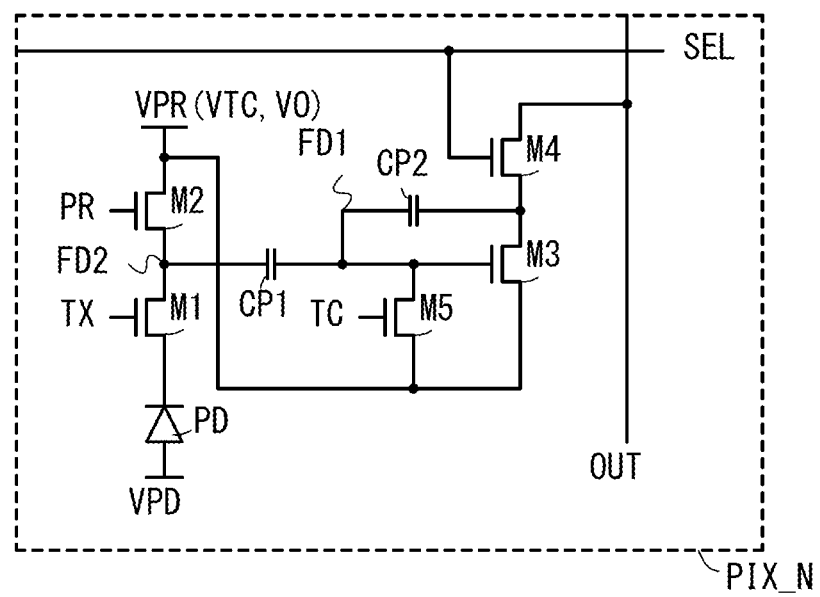

Note that even when the same potential is applied to wirings, the wirings are illustrated as different wirings in FIG. 1A; however, they may be illustrated as the same wiring. For example, as in a pixel PIX_K in FIG. 20A, the power supply line VTC and the power supply line VO which are supplied with a high potential may be illustrated as the same wiring. Alternatively, as in a pixel PIX_L in FIG. 20B, the power supply lines VPR and VTC which are supplied with a high potential may be illustrated as the same wiring. Alternatively, as in a pixel PIX_M in FIG. 21A, the power supply lines VPR and VO which are supplied with a high potential may be illustrated as the same wiring. Alternatively, as in a pixel PIX_N in FIG. 21B, the power supply lines VPR, VTC, and VO which are supplied with a high potential may be illustrated as the same wiring.

From Time TC1 to Time TC2, the signal line TC is set at "H", and the signal line SEL is set at "H" and then set at "L". Note that the potential of the signal line OUT is a low potential. In the period, a potential VTC is supplied to the gate of the transistor M3, so that the potential of the one electrode of the capacitor CP2 becomes the potential VTC. The potential of the one of the source and the drain (here, the source) of the transistor M3 connected to the other electrode of the capacitor CP2 is a low potential that is the potential of the signal line OUT when the signal line SEL is set at "H", and after the signal line SEL is set at "L", current flows from the power supply line VO through the transistor M3, so that the potential of the one of the source and the drain of the transistor M3 increases. That is, similarly, the potential of the other electrode of the capacitor CP2 becomes the low potential that is the potential of the signal line OUT when the signal line SEL is set at "H", and after the signal line SEL is set at "L", the potential of the other electrode of the capacitor CP2 increases. In other words, a potential difference between the one electrode and the other electrode of the capacitor CP2 decreases. Here, when the potential difference between the one electrode and the other electrode of the capacitor CP2 reaches the threshold voltage Vth of the transistor M3, the transistor M3 is turned off and the change in the potential of the other electrode of the capacitor CP2 is stopped. Thus, a potential corresponding to the threshold voltage Vth of the transistor M3 is kept between the one electrode and the other electrode of the capacitor CP2.

Note that the transistor M3 need not necessarily reach a completely off state in the above operation. That is, for example, a somewhat small current may flow in the transistor M3. Therefore, the potential difference between the one electrode and the other electrode of the capacitor CP2 need not necessarily reach the threshold voltage Vth of the transistor M3, and may be a potential difference that is close to or corresponds to the threshold voltage Vth, for example.

Figure 19:
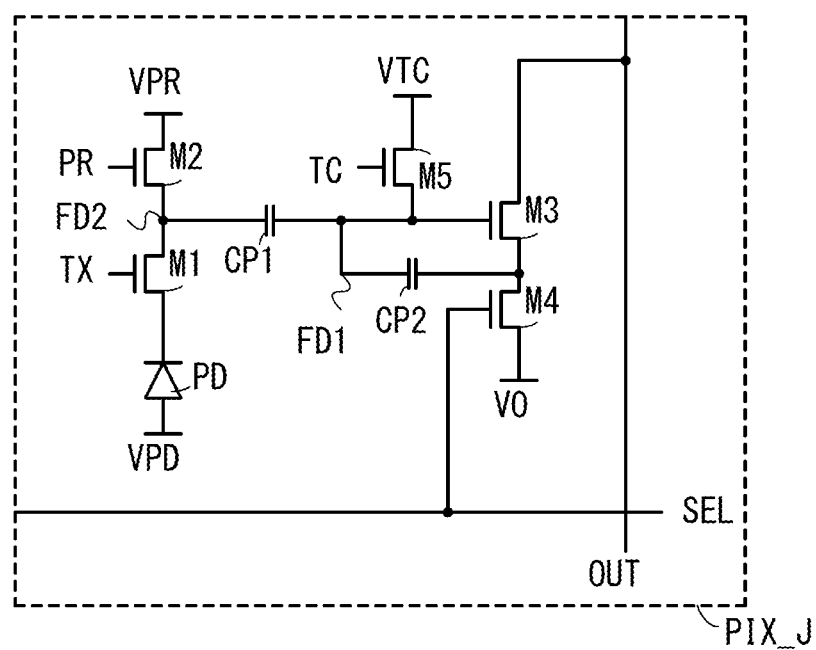
FIG. 19 is a circuit diagram for describing one embodiment of the present invention.

Note that although the current flowing in the transistor M3 flows from the power supply line VO toward the signal line OUT in the circuit configuration of the pixel in FIG. 1A, the direction of the current flow may be inverted. That is, a circuit configuration in which the current flowing in the transistor M3 flows from the power supply line OUT toward the power supply line VO may be employed. In this case, a circuit configuration of a pixel PIX_J in FIG. 19 may be employed, for example. Note that in the circuit configuration of the pixel PIX_J in FIG. 19, a low potential may be applied to the power supply line VO and a high potential may be applied to the power supply line OUT.

From Time TC2 to Time T1, the signal line TC is set at "L". In this period, the potential of the node FD1 is retained.

From Time T1 to Time T2, the signal line PR and the signal line TX are set at "H". In this period, the potential of the node FD2 is set to the potential of the power supply line VPR. The potential of the node FD1 increases by $V1 \cdot C1/(C1+C2+Cg)$ where V1 represents an increase in the potential of the node FD2, C1 represents the capacitance of the capacitor CP1, C2 represents the capacitance of the capacitor CP2, and Cg represents the gate capacitance of the transistor M3. In other words, the gate potential of the transistor M3 is $V1 \cdot C1/(C1+C2+Cg)+Vth$.

From Time T2 to Time T3, the signal line PR is set at "L", and the signal line TX is set at "H". In this period, the potential of the node FD2 decreases in accordance with light with which the photodiode PD is irradiated. The potential of the node FD1 decreases by $V2 \cdot C1/(C1+C2+Cg)$ where V2 represents a decrease in the potential of the node FD2, C1 represents the capacitance of the capacitor CP1, C2 represents the capacitance of the capacitor CP2, and Cg represents the gate capacitance of the transistor M3. In other words, the gate potential of the transistor M3 is $V1 \cdot C1/(C1+C2+Cg)+Vth-V2 \cdot C1/(C1+C2+Cg)$.

Note that an increase in the intensity of light with which the photodiode PD is irradiated reduces the potential of the node FD2. Thus, an increase in the intensity of light with which the photodiode PD is irradiated reduces the potential of the node FD1.

From Time T3 to Time T4, the signal line TX is set at "L". In this period, the reduction in the potentials of the nodes FD1 and FD2 is stopped, so that the nodes FD1 and FD2 are set at a constant potential.

From Time T4 to Time T5, the signal line SEL is set at "H". In this period, a signal corresponding to the imaging data is output to the signal line OUT depending on the potential of the node FD1. Note that a decrease in the potential of the node FD1 reduces the potential of the signal line OUT. That is, an increase in the intensity of the light with which the photodiode PD is irradiated reduces the potential of the signal line OUT.

Note that in this period, the transistor M3 is assumed to be operated in a saturation region, and when a drain current Id is represented as $Id=(\frac{1}{2})\beta(Vgs-Vth)^2$, $Id=(\frac{1}{2})\beta(V1 \cdot C1/(C1+C2+Cg)-V2 \cdot C1/(C1+C2+Cg))^2$ is satisfied, so that the drain current Id is unrelated to the threshold voltage Vth.

That is, regardless of variation in the threshold voltage Vth of the transistor M3, the drain current Id in accordance with the intensity of the light with which the photodiode PD is irradiated is obtained.

A period from Time T6 to Time T10 can be explained in a manner similar to that for the period from Time T1 to Time T5. Note that a case where the intensity of the light with which the photodiode PD is irradiated in the period from Time T6 to Time T10 is lower than that in the period from Time T1 to Time T5 is shown. In this case, the potential of the signal line OUT in a period from Time T9 to Time T10 is higher than that of the signal line OUT in a period from Time T4 to Time T5.

Figure 2:
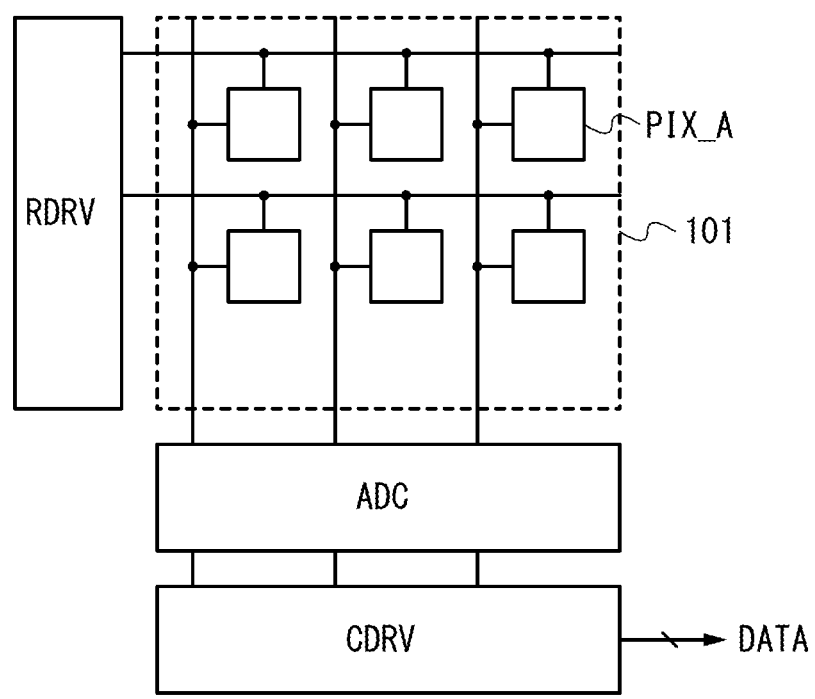
FIG. 2 is a block diagram for describing one embodiment of the present invention.

FIG. 2 is a block diagram illustrating a configuration of an imaging device including the pixels PIX_A each of which is illustrated in FIG. 1A. The imaging device illustrated in FIG. 2 includes a pixel portion 101 including the plurality of pixels PIX_A arranged in matrix, an A/D converter circuit ADC which is a digital processing circuit, a column driver CDRV, and a row driver RDRV.

The A/D converter circuit ADC converts imaging data output from the pixels PIX_A in each row into digital data by A/D conversion performed on each column. The pieces of digital data corresponding to the A/D converted imaging data of the pixels PIX_A in the columns are sequentially extracted as DATA by the column driver CDRV. As the column driver CDRV and the row driver RDRV, for example, a decoder, a shift register, or the like is used.

The above configuration enables the imaging device to obtain highly accurate imaging data.

In this embodiment, one embodiment of the present invention has been described. Other embodiments of the present invention are described in Embodiments 2 to 9. Note that one embodiment of the present invention is not limited thereto. An example in which one embodiment of the present invention is applied to an imaging device is described, one embodiment of the present invention is not limited thereto. Depending on circumstances, one embodiment of the present invention is not necessarily applied to an imaging device. One embodiment of the present invention may be applied to a circuit having another function, for example. For example, the case where the influence of the variation in the threshold voltage Vth is reduced is shown in one embodiment of the present invention, one embodiment of the present invention is not limited thereto. Depending on the circumstances, the influence of the variation in the threshold voltage Vth need not necessarily be reduced. For example, an influence of variation in other characteristics may be reduced in one embodiment of the present invention.

Embodiment 2

A pixel with a configuration different from that described in Embodiment 1 is described with reference to FIGS. 3A and 3B and FIG. 4.

In this specification and the like, an imaging device refers to any device that has an imaging function. Furthermore, an imaging device refers to a circuit that has an imaging function or the whole of a system that includes the circuit.

Figure 3A:
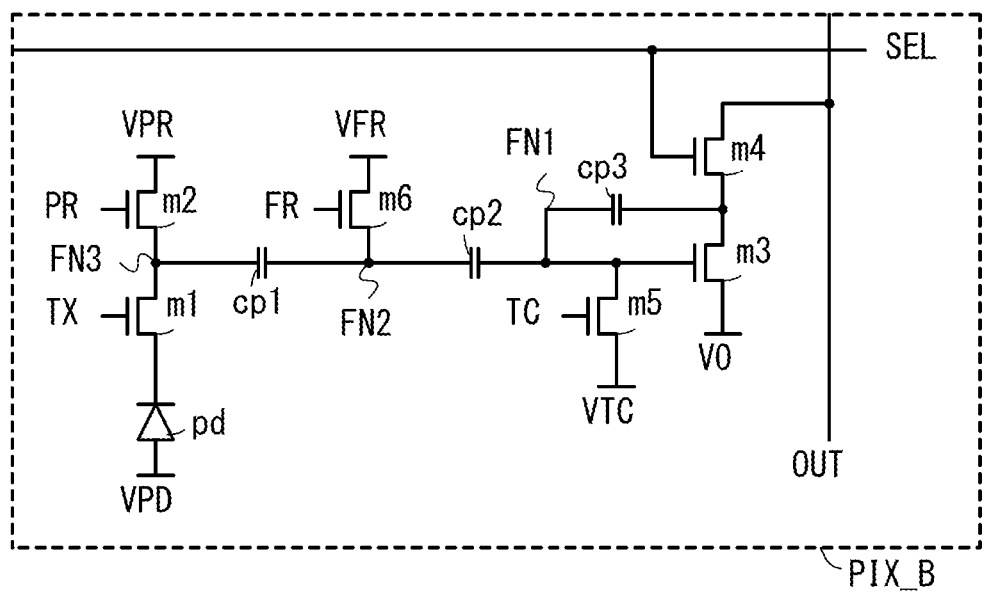
FIGS. 3A and 3B are a circuit diagram and a timing chart for describing one embodiment of the present invention.

FIG. 3A is a circuit diagram illustrating a configuration of a pixel included in an imaging device of one embodiment of the present invention. In FIG. 3A, a pixel PIX_B includes transistors m1 to m6, a capacitor cp1, a capacitor cp2, a capacitor cp3, and a photodiode pd.

Potentials are supplied from the power supply line VPD, the power supply line VPR, a power supply line VFR, the power supply line VTC, and the power supply line VO to the transistors, the capacitors, and the photodiode illustrated in FIG. 3A. Furthermore, control signals are supplied from the signal line TX, the signal line PR, a signal line FR, the signal line TC, and the signal line SEL to the elements, and imaging data of the pixel is output to the signal line OUT.

One electrode of the photodiode pd is connected to the power supply line VPD. The power supply line VPD may be referred to as a first wiring. The photodiode pd has a function of generating photoelectric-converted signal charge. The photodiode pd may be referred to as a photoelectric conversion element.

One electrode of the capacitor cp1 is connected to one of a source and a drain of the transistor m1. The other electrode of the capacitor cp1 is connected to one electrode of the capacitor cp2. The capacitor cp1 may be referred to as a first capacitor. The capacitor cp2 may be referred to as a second capacitor.

One of a source and a drain of the transistor m6 is connected to the one electrode of the capacitor cp2. The other of the source and the drain of the transistor m6 is connected to the power supply line VFR. A gate of the transistor m6 is connected to the signal line FR. The power supply line VFR may be referred to as a second wiring. The transistor m6 may be referred to as a first transistor.

The other electrode of the capacitor cp2 is connected to a gate of the transistor m3. The transistor m3 may be referred to as a second transistor.

One electrode of the capacitor cp3 is connected to the gate of the transistor m3. The other electrode of the capacitor cp3 is connected to one of a source and a drain of the transistor m3. The capacitor cp3 may be referred to as a third capacitor.

The other of the source and the drain of the transistor m3 is connected to the power supply line VO. The power supply line VO may be referred to as a third wiring.

One of a source and a drain of the transistor m5 is connected to the gate of the transistor m3. The other of the source and the drain of the transistor m5 is connected to the power supply line VTC. A gate of the transistor m5 is connected to the signal line TC. The transistor m5 may be referred to as a third transistor. The power supply line VTC may be referred to as a fourth wiring.

The other of the source and the drain of the transistor m1 is connected to the other electrode of the photodiode pd. A gate of the transistor m1 is connected to the signal line TX. The transistor m1 may be referred to as a fourth transistor. The transistor m1 has a function of supplying the signal charge generated in the photodiode pd to the one electrode of the capacitor cp1 by controlling electrical connection between the one electrode of the capacitor cp1 and the other electrode of the photodiode pd.

One of a source and a drain of the transistor m2 is connected to the power supply line VPR. The other of the source and the drain of the transistor m2 is connected to the one electrode of the capacitor cp1. A gate of the transistor m2 is connected to the signal line PR. The transistor m2 may be referred to as a fifth transistor. The transistor m2 has a function of supplying the potential of the power supply line VPR to the one electrode of the capacitor cp1. The power supply line VPR may be referred to as a fifth wiring.

One of a source and a drain of the transistor m4 is connected to the one of the source and the drain of the transistor m3. The other of the source and the drain of the transistor m4 is connected to the signal line OUT. A gate of the transistor m4 is connected to the signal line SEL. The transistor m4 has a function of selectively controlling a current flowing between the power supply line VO and the signal line OUT in response to a control signal of the signal line SEL.

As described below, the transistor m5 has a function of supplying the potential of the power supply line VTC to the one electrode of the capacitor cp2 in order that the capacitor cp2 retains the threshold voltage of the transistor m3. The capacitor cp1 is capable of bringing the other electrode of the capacitor cp1 into an electrically floating state, and is capable of changing the potential of the other electrode of the capacitor cp1 when the potential of the one electrode of the capacitor cp1 is changed in accordance with signal charge generated in the photodiode pd. The capacitor cp2 is capable of bringing the other electrode of the capacitor cp2 into an electrically floating state while the capacitor cp3 retains the threshold voltage, and is capable of changing the potential of the gate of the transistor m3 when the potential of the one electrode of the capacitor cp2 is changed in response to the change in the potential of the other electrode of the capacitor cp1.

Note that FIG. 3A may be referred to for connection relationships between the transistors, the capacitors, and the photodiode.

In FIG. 3A, a node connected to the gate of the transistor m3 is referred to as a node FN1. In addition, in FIG. 3A, a node connected to the one electrode of the capacitor cp2 is referred to as a node FN2. In FIG. 3A, a node connected to the one electrode of the capacitor cp1 is referred to as a node FN3. Charge corresponding to imaging data is accumulated in the nodes FN1 to FN3.

Owing to capacitive coupling of the capacitor cp1 and the capacitor cp2, the potential of the node FN2 changes in response to a change in the potential of the node FN3. Therefore, the capacitance value of the capacitor cp1 is preferably larger than that of the capacitor cp2. Owing to capacitive coupling of the capacitor cp2 and a combined capacitance of the capacitor cp3 and the gate capacitance of the transistor m3, the potential of the node FN1 changes in response to a change in the potential of the node FN2. Therefore, the capacitance value of the capacitor cp2 is preferably larger than the capacitance value of the combined capacitance of the capacitor cp3 and the gate capacitance of the transistor m3.

Figure 3B:
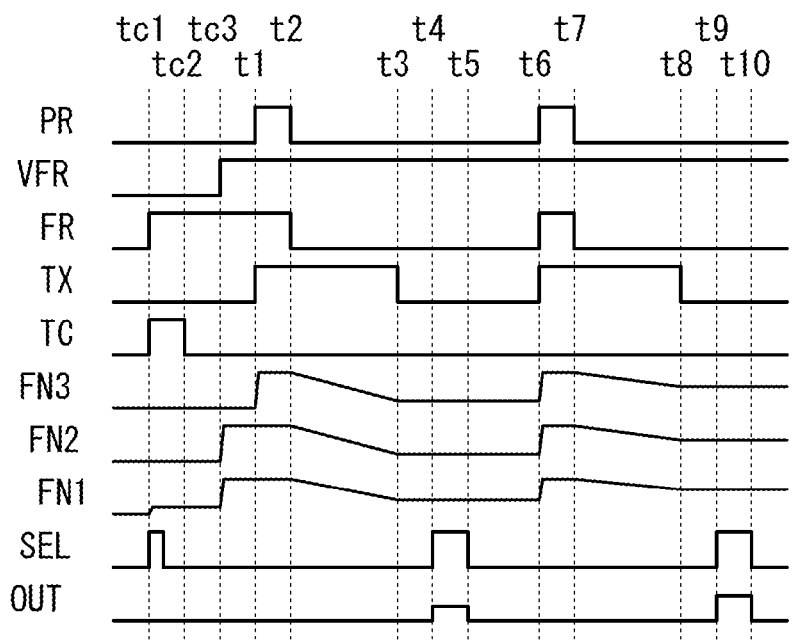
Figure 4:
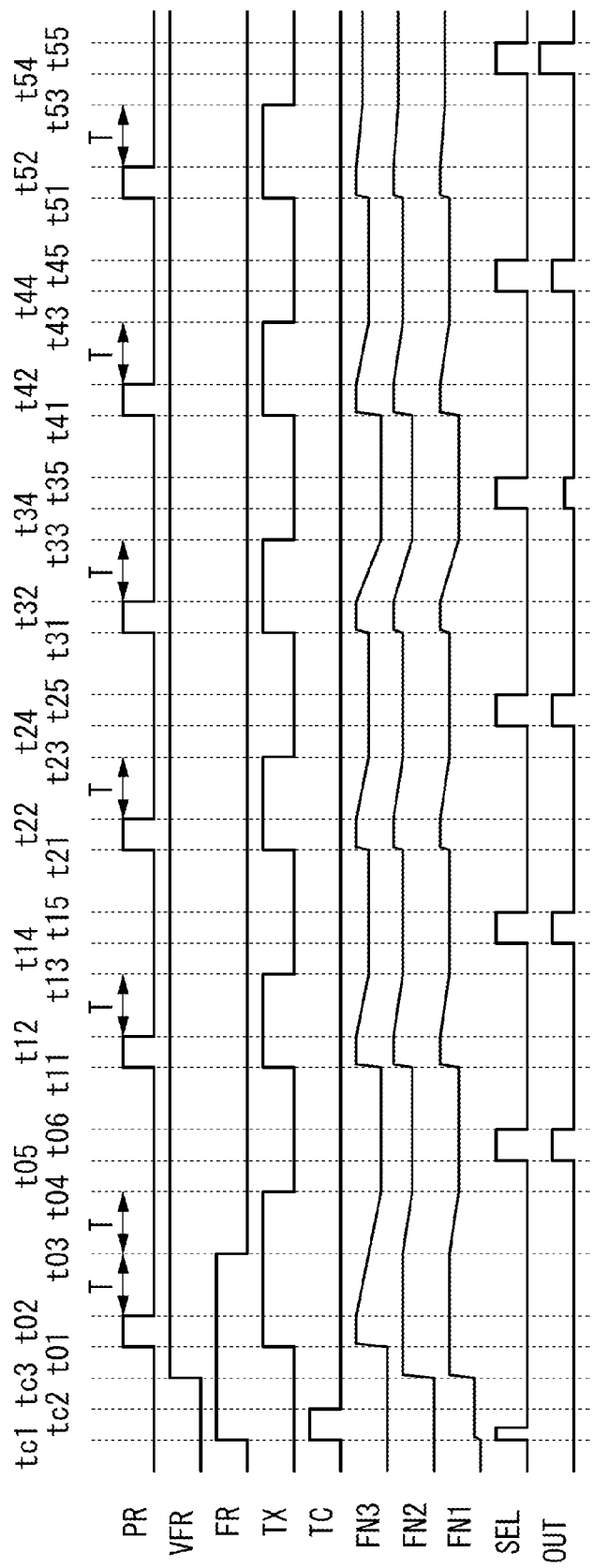
FIG. 4 is a timing chart for describing one embodiment of the present invention.

FIG. 3B and FIG. 4 are timing charts showing operations of the pixel PIX_B in FIG. 3A. FIG. 3B shows operations for obtaining normal imaging data. FIG. 4 shows operations for obtaining difference data. Here, for example, the power supply line VPD is set at a low potential, the power supply line VPR is set at a high potential, the power supply line VTC is set at a high potential, and the power supply line VO is set at a high potential.

First, FIG. 3B is described.

From Time tc1 to Time tc2, the signal line FR is set at "H", the signal line TC is set at "H", and the signal line SEL is set at "H" and then set at "L". Note that the potential of the power supply line VFR is a low potential. The potential of the signal line OUT is a low potential. In the period, the potential VTC is supplied to the gate of the transistor m3, so that the potential of the one electrode of the capacitor cp3 becomes the potential VTC. The potential of the one of the source and the drain (here, the source) of the transistor m3 connected to the other electrode of the capacitor cp3 is a low potential that is the potential of the signal line OUT when the signal line SEL is set at "H", and after the signal line SEL is set at "L", current flows from the power supply line VO through the transistor m3, so that the potential of the one of the source and the drain of the transistor m3 increases. That is, similarly, the potential of the other electrode of the capacitor cp3 becomes the low potential that is the potential of the signal line OUT when the signal line SEL is set at "H", and after the signal line SEL is set at "L", the potential of the other electrode of the capacitor cp3 increases. In other words, a potential difference between the one electrode and the other electrode of the capacitor cp3 decreases. Here, when the potential difference between the one electrode and the other electrode of the capacitor cp3 reaches the threshold voltage Vth of the transistor m3, the transistor m3 is turned off and the change in the potential of the other electrode of the capacitor cp3 is stopped. Thus, a potential corresponding to the threshold voltage Vth of the transistor m3 is kept between the one electrode and the other electrode of the capacitor cp3.

From Time tc2 to Time tc3, the signal line TC is set at "L". In this period, the potential of the node FN1 is retained Sequentially, at Time tc3, the power supply line VFR is set to a high potential. At this time, the potential of the node FN2 is set at the potential of the power supply line VFR. Furthermore, the potential of the node FN1 increases by $v1 \cdot c2/(c2+c3+cg)$ where v1 represents an increase in the potential of the node FN2, c2 represents the capacitance of the capacitor cp2, c3 represents the capacitance of the capacitor cp3, and cg represents the gate capacitance of the transistor m3. That is, the gate potential of the transistor m3 is $v1 \cdot c2/(c2+c3+cg)+Vth$.

From Time t1 to Time t2, the signal line PR, the signal line FR, and the signal line TX are set at "H". In this period, the potential of the node FN3 is set to the potential of the power supply line VPR.

From Time t2 to Time t3, the signal line PR and the signal line FR are set at "L", and the signal line TX is set at "H". In this period, the potential of the node FN3 decreases in accordance with light with which the photodiode PD is irradiated. The potential of the node FN2 decreases by $v2 \cdot c1/(c1+c2)$ where v2 represents a reduction in the potential of the node FN3 and c1 represents the capacitance of the capacitor cp1. Furthermore, the potential of the node FN1 decreases by $v2 \cdot c1/(c1+c2) \cdot c2/(c2+c3+cg)$. That is, the gate potential of the transistor m3 is $v1 \cdot c2/(c2+c3+cg)+Vth-v2 \cdot c1/(c1+c2) \cdot c2/(c2+c3+cg)$.

Note that an increase in the intensity of light with which the photodiode pd is irradiated reduces the potential of the node FN3. Thus, an increase in the intensity of light with which the photodiode pd is irradiated reduces the potential of the node FN2. Furthermore, an increase in the intensity of light with which the photodiode pd is irradiated reduces the potential of the node FN1.

From Time t3 to Time t4, the signal line TX is set at "L". In this period, the reduction in the potentials of the nodes FN1 to FN3 is stopped, so that the nodes FN1 to FN3 are set at a constant potential.

From Time t4 to Time t5, the signal line SEL is set at "H". In this period, a signal corresponding to the imaging data is output to the signal line OUT depending on the potential of the node FN1. Note that a decrease in the potential of the node FN1 reduces the potential of the signal line OUT. That is, an increase in the intensity of the light with which the photodiode pd is irradiated reduces the potential of the signal line OUT.

Note that in this period, the transistor m3 is assumed to be operated in a saturation region, and when a drain current Id is represented as $Id=(1/2)\beta(Vgs-Vth)^2$, $Id=(1/2)\beta(v1 \cdot c2/(c2+c3+cg)-v2 \cdot c1/(c1+c2) \cdot c2/(c2+c3+cg))^2$ is satisfied, so that the drain current Id is unrelated to the threshold voltage Vth. That is, regardless of variation in the threshold voltage Vth of the transistor m3, the drain current Id in accordance with the intensity of the light with which the photodiode pd is irradiated is obtained.

A period from Time t6 to Time t10 can be explained in a manner similar to that for the period from Time t1 to Time t5. Note that a case where the intensity of the light with which the photodiode pd is irradiated in the period from Time t6 to Time t10 is lower than that in the period from Time t1 to Time t5 is shown. In this case, the potential of the signal line OUT in a period from Time t9 to Time t10 is higher than that of the signal line OUT in a period from Time t4 to Time t5.

Next, FIG. 4 is described.

A period from Time tc1 to Time tc3 in FIG. 4 can be explained in a manner similar to that of the period from Time tc1 to Time tc3 in FIG. 3B.

A period from Time t01 to Time t06 corresponds to an operation period for obtaining first imaging data in an initial frame.

From Time t01 to Time t02, the signal line PR, the signal line FR, and the signal line TX are set at "H". In this period, the node FN3 is set at the potential of the power supply line VPR, and the node FN2 is set at the potential of the power supply line VFR, so that the potential of the node FN1 is $v1 \cdot c2/(c2+c3+cg)+Vth$.

From Time t02 to Time t03, the signal line PR is set at "L", and the signal line FR and the signal line TX are set at "H".

In this period, the potential of the node FN3 decreases in accordance with the intensity of light with which the photodiode pd is irradiated. Here, the amount of change in the potential of the node FN3 is regarded as $\Delta v2$, the potential of the node FN3 is $VPR-\Delta v2$. Note that an increase in the intensity of the light with which the photodiode pd is irradiated reduces the potential of the node FN3. Note that the potentials of the nodes FN2 and FN1 do not change.

From Time t03 to Time t04, the signal line PR and the signal line FR are set at "L", and the signal line TX is set at "H". Note that a period from Time t02 to Time t03 and a period from Time t03 to Time t04 are made to have the same length and each correspond to a period T. In the period, the potential of the node FN3 further decreases in accordance with the light with which the photodiode pd is irradiated, so that the potential of the node FN3 is $VPR-2 \cdot \Delta v2$.

The period from Time t02 to Time t03 and the period from Time t03 to Time t04 are made to have the same length to each correspond to the period T for the purpose of equalizing potential change in the node FN3 in the period from Time t02 to Time t03 with that in the period from Time t03 to Time t04. Therefore, it is also effective to appropriately adjust the length of the period from Time t02 to Time t03 and the length of the period from Time t03 to Time t04 so that the potential changes in the node FN3 in these periods are equalized with each other.

From Time t03 to Time t04, owing to capacitive coupling of the capacitor cp1 and the capacitor cp2, the potential of the node FN2 also decreases, so that the potential of the node FN2 is $VFR-\Delta v1$. Here, $\Delta v1$ is $\Delta c1/(c1+c2)$. Owing to capacitive coupling of the capacitor cp2 and a combined capacitance of the capacitor cp3 and the gate capacitance of the transistor m3, the potential of the node FN1 also decreases, so that the potential of the node FN1 is $v1 \cdot c2/(c2+c3+cg)+Vth-\Delta v$. Here, $\Delta v = \Delta v1 \cdot c2/(c2+c3+cg) = \Delta v2 \cdot c1/(c1+c2) \cdot c2/(c2+c3+cg)$ is satisfied.

Note that an increase in the intensity of light with which the photodiode pd is irradiated reduces the potential of the node FN3. In addition, an increase in the intensity of light with which the photodiode pd is irradiated reduces the potential of the node FN2. Furthermore, an increase in the intensity of light with which the photodiode pd is irradiated reduces the potential of the node FN1.

From Time t04 to Time t05, the signal line TX is set at "L". In this period, the reduction in the potentials of the nodes FN1 to FN3 is stopped, so that the nodes FN1 to FN3 are set at a constant potential.

From Time t05 to Time t06, the signal line SEL is set at "H". In this period, a signal corresponding to the imaging data is output to the signal line OUT depending on with the potential of the node FN1. Note that a decrease in the potential of the node FN1 reduces the potential of the signal line OUT. That is, an increase in the intensity of the light with which the photodiode pd is irradiated reduces the potential of the signal line OUT.

Note that in this period, the transistor m3 is assumed to be operated in a saturation region, and when the drain current Id is represented as $Id=(\frac{1}{2})\beta(Vgs-Vth)^2$, $Id=(\frac{1}{2})\beta(v1 \cdot c2/(c2+c3+cg)-\Delta v2 \cdot c1/(c1+c2) \cdot c2/(c2+c3+cg))^2$ is satisfied, so that the drain current Id is unrelated to the threshold voltage Vth. That is, regardless of variation in the threshold voltage Vth of the transistor m3, the drain current Id in accordance with the intensity of the light with which the photodiode pd is irradiated is obtained.

Next, a period from Time t11 to Time t15 corresponds to an operation period for obtaining second imaging data. FIG. 4 particularly shows a case where a difference between the first imaging data and the second imaging data is zero, that is, the intensity of light with which the photodiode is irradiated in the period is equal to that in the period from Time t01 to Time t05.

From Time t11 to Time t12, the signal line PR is set at "H", the signal line FR is set at "L", and the signal line TX is set at "H". In this period, the potential of the node FN3 increases by the potential VPR, i.e., by $2 \cdot \Delta v2$. Furthermore, the potential of the node FN2 increases by $2 \cdot \Delta v1$ to be $VFR+\Delta v1$. In addition, the potential of the node FN1 increases by $2 \cdot \Delta v$ to be $v1 \cdot c2/(c2+c3+cg)+Vth+\Delta v$.

From Time t12 to Time t13, the signal line PR and the signal line FR are set at "L", and the signal line TX is set at "H". Note that the period from Time t12 to Time t13 have the same length as the period from Time t03 to Time t04 and corresponds to the period T.

In the period, the potential of the node FN2 decreases by $\Delta v2$ in accordance with the intensity of light with which the photodiode pd is irradiated to be $VPR-\Delta v2$. Furthermore, the potential of the node FN1 also decreases by $\Delta v1$ to be VFR. Moreover, the potential of the node FN1 decreases by $\Delta v$ to be $v1 \cdot c2/(c2+c3+cg)+Vth$. That is, the potential of the node FN1 at Time t03 is equal to that at Time t13, which indicates that the difference between the first imaging data and the second imaging data is zero.

From Time t13 to Time t14, the signal line TX is set at "L". The reduction in the potentials of the nodes FN1 to FN3 is stopped.

From Time t14 to Time t15, the signal line SEL is set at "H". In this period, a signal corresponding to the imaging data is output to the signal line OUT depending on the potential of the node FN1. Note that the potential of the signal is equal to the potential of the signal line OUT in the period from Time t04 to Time t05 and corresponds to a potential at which the difference between the first image data and the second image data is zero.

Next, a period from Time t21 to Time t25 corresponds to an operation period for obtaining third imaging data. FIG. 4 particularly shows a case where a difference between the first imaging data and the third imaging data is zero, that is, the intensity of light with which the photodiode is irradiated in the period is equal to that in the period from Time t01 to Time t05.

From Time t21 to Time t22, the signal line PR is set at "H", the signal line FR is set at "L", and the signal line TX is set at "H". In this period, the potential of the node FN3 increases by VPR, i.e., by $\Delta v2$. Furthermore, the potential of the node FN2 increases by $\Delta v1$ to be VFR+$\Delta v1$. In addition, the potential of the node FN1 increases by $\Delta v$ to be v1·c2/(c2+c3+cg)+Vth+$\Delta v$.

From Time t22 to Time t23, the signal line PR and the signal line FR are set at "L", and the signal line TX is set at "H". Note that the period from Time t22 to Time t23 have the same length as the period from Time t03 to Time t04 and corresponds to the period T.

In the period, in accordance with the intensity of light with which the photodiode pd is irradiated, the potential of the node FN2 decreases by $\Delta v2$ to be VPR−$\Delta v2$, the potential of the node FN2 decreases by $\Delta v1$ to be VFR, and the potential of the node FN1 decreases by $\Delta v$ to be v1·c2/(c2+c3+cg)+Vth. That is, the potential of the node FN1 at Time t03 is equal to that at Time t23, which indicates that the difference between the first imaging data and the third imaging data is zero.

From Time t23 to Time t24, the signal line TX is set at "L". The reduction in the potentials of the nodes FN1 to FN3 is stopped.

From Time t24 to Time t25, the signal line SEL is set at "H". In this period, a signal corresponding to imaging data is output to the signal line OUT depending on the potential of the node FN1. Note that the potential of the signal is equal to the potential of the signal line OUT in the period from Time t04 to Time t05 and corresponds to a potential at which the difference between the first image data and the third image data is zero.

Next, a period from Time t31 to Time t35 corresponds to an operation period for obtaining fourth imaging data. In particular, in this period, the difference between the first imaging data and the fourth imaging data is finite (negative), that is, the intensity of light with which the photodiode is irradiated is higher than that in the period from Time t01 to Time t05.

From Time t31 to Time t32, the signal line PR is set at "H", the signal line FR is set at "L", and the signal line TX is set at "H". In this period, the potential of the node FN3 increases by VPR, i.e., by $\Delta v2$. Furthermore, the potential of the node FN2 increases by $\Delta v1$ to be VFR+$\Delta v1$. In addition, the potential of the node FN1 increases by $\Delta v$ to be v1·c2/(c2+c3+cg)+Vth+$\Delta v$.

From Time t32 to Time t33, the signal line PR and the signal line FR are set at "L", and the signal line TX is set at "H". Note that the period from Time t32 to Time t33 have the same length as the period from Time t03 to Time t04 and corresponds to the period T.

In this period, in accordance with the intensity of light with which the photodiode pd is irradiated, the potential of the node FN3 decreases by $\Delta v2'$ ($\Delta v2'>\Delta v2$) to be VPR−$\Delta v2'$, the potential of the node FN2 decreases by $\Delta v1'$ ($\Delta v1'>\Delta v1$, $\Delta v1'=\Delta v2'\cdot c1/(c1+c2)$) to be VFR+$\Delta v1-\Delta v1'$, and the potential of the node FN1 decreases by $\Delta v'$ ($\Delta v'>\Delta v$, $\Delta v'=\Delta v1'\cdot c2/(c2+c3+cg)=\Delta v2'\cdot c1/(c1+c2)\cdot c2/(c2+c3+cg)$) to be v1·c2/(c2+c3+cg)+Vth+$\Delta v-\Delta v'$. This indicates that the difference between the first imaging data and the fourth imaging data is finite (negative).

From Time t33 to Time t34, the signal line TX is set at "L". The reduction in the potentials of the nodes FN1 to FN3 is stopped.

From Time t34 to Time t35, the signal line SEL is set at "H". In this period, a signal corresponding to the imaging data is output to the signal line OUT depending the potential of the node FN1. Note that the potential of the signal is lower than the potential of the signal line OUT in a period from Time t04 to Time t05 and corresponds to a potential at which the difference between the first image data and the fourth image data is finite (negative).

Next, a period from Time t41 to Time t45 corresponds to an operation period for obtaining fifth imaging data. In particular, a difference between the first imaging data and the fifth imaging data is zero in the period, and the intensity of light with which the photodiode is irradiated in the period is equal to that in the period from Time t01 to Time t05.

From Time t41 to Time t42, the signal line PR is set at "H", the signal line FR is set at "L", and the signal line TX is set at "H". In this period, the potential of the node FN3 increases by VPR, i.e., by $\Delta v2'$. In addition, the potential of the node FN2 increases by $\Delta v1'$ to be VFR+$\Delta v1$. Furthermore, the potential of the node FN1 increases by $\Delta v'$ to be v1·c2/(c2+c3+cg)+Vth+$\Delta v$.

From Time t42 to Time t43, the signal line PR and the signal line FR are set at "L", and the signal line TX is set at "H". Note that the period from Time t42 to Time t43 have the same length as the period from Time t03 to Time t04 and corresponds to the period T.

In the period, in accordance with the intensity of light with which the photodiode pd is irradiated, the potential of the node FN3 decreases by $\Delta v2$ to be VPR−$\Delta v2$, the potential of the node FN2 decreases by $\Delta v1$ to be VFR, and the potential of the node FN1 decreases by $\Delta v$ to be v1·c2/(c2+c3+cg)+Vth. The potential of the node FN1 is a potential at which the difference between the first imaging data and the fifth imaging data is zero.

From Time t43 to Time t44, the signal line TX is set at "L". The reduction in the potentials of the nodes FN1 to FN3 is stopped.

From Time t44 to Time t45, the signal line SEL is set at "H". In this period, a signal corresponding to imaging data is output to the signal line OUT depending on the potential of the node FN1. Note that the potential of the signal is equal to the potential of the signal line OUT in the period from Time t04 to Time t05 and corresponds to a potential at which the difference between the first image data and the fifth image data is zero.

Next, a period from Time t51 to Time t55 corresponds to an operation period for obtaining sixth imaging data. In particular, in this period, the difference between the first imaging data and the sixth imaging data is finite (positive), that is, the intensity of light with which the photodiode is irradiated is lower than that in the period from Time t01 to Time t05.

From Time t51 to Time t52, the signal line PR is set at "H", the signal line FR is set at "L", and the signal line TX is set at "H". In this period, the potential of the node FN3 increases by VPR, i.e., by $\Delta v2$. Furthermore, the potential of the node FN2 increases by $\Delta v1$ to be VFR+$\Delta v1$. In addition, the potential of the node FN1 increases by $\Delta v$ to be v1·c2/(c2+c3+cg)+Vth+$\Delta v$.

From Time t52 to Time t53, the signal line PR and the signal line FR are set at "L", and the signal line TX is set at "H". Note that the period from Time t52 to Time t53 have the same length as the period from Time t03 to Time t04 and corresponds to the period T.

In this period, in accordance with light with which the photodiode pd is irradiated, the potential of the node FN3 decreases by $\Delta v2''(\Delta v2''<\Delta v2)$ to be VPR−$\Delta v2''$, the potential of the node FN2 decreases by $\Delta v1''$ ($\Delta v1''<\Delta v1$, $\Delta v1''=\Delta v2''\cdot c1/(c1+c2)$) to be VFR+$\Delta v1-\Delta v1''$, and the potential of the node FN1 decreases by $\Delta v''(\Delta v''<\Delta v$, $\Delta v''=\Delta v1''\cdot c2/(c2+c3+cg)=\Delta v2''\cdot c1/(c1+c2)\cdot c2/(c2+c3+cg))$ to be $v1\cdot c2/(c2+c3+cg)+Vth+\Delta v-\Delta v''$. The potential of the node FN1 indicates that the difference between the first imaging data and the sixth imaging data is finite (positive)

From Time t53 to Time t54, the signal line TX is set at "L". The reduction in the potentials of the nodes FN1 to FN3 is stopped.

From Time t54 to Time t55, the signal line SEL is set at "H". In this period, a signal corresponding to the imaging data is output to the signal line OUT depending on the potential of the node FN1. Note that the potential of the signal is higher than the potential of the signal line OUT in the period from Time t04 to Time t05 and corresponds to a potential at which the difference between the first image data and the sixth image data is finite (positive).

As described above, in the imaging device of this embodiment, after the first imaging data is obtained, imaging data can be obtained repeatedly and a difference between the first imaging data and other imaging data can be output. Such an operation is possible when the potentials of the nodes FN3, FN2, and FN1 are set to VPR, VFR+$\Delta v1$, and $v1\cdot c2/(c2+c3+cg)+Vth+\Delta v$, respectively, in the beginning of each operation period for obtaining imaging data (corresponding to the periods from Time t11 to Time t12, from Time t21 to Time t22, from Time t31 to Time t32, from Time t41 to Time t42, and from Time t51 to Time t52) by setting the signal line PR at "H", the signal line FR at "L", and the signal line TX at "H. While the nodes of FN1 to FN3 are set at the above potentials, a difference with the first imaging data can be detected. That is, a difference can be detected even for a very gentle change which cannot be detected by image comparison of pieces of imaging data obtained in sequential frames. Furthermore, the signal line SEL is set at "H" in the state where the nodes are set at the above potentials, whereby a signal corresponding to the first imaging data can be read out. That is, imaging data and difference data can be obtained with the same pixel circuit.

Figure 5:
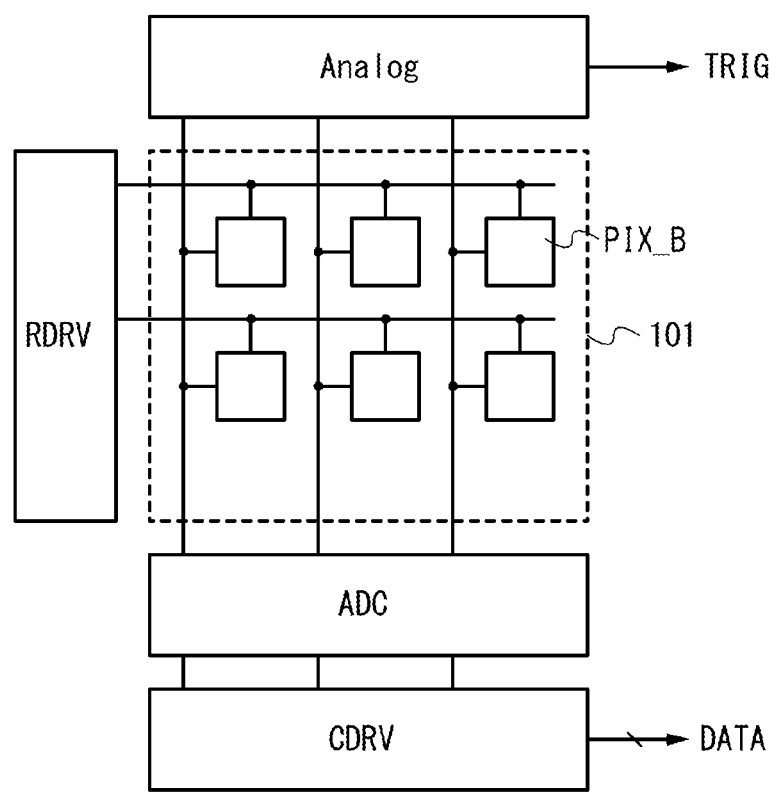
FIG. 5 is a block diagram for describing one embodiment of the present invention.

FIG. 5 is a block diagram showing a configuration of an imaging device including the pixels PIX_B illustrated in FIG. 3A. The imaging device illustrated in FIG. 5 includes the pixel portion 101 including the plurality of pixels PIX_B arranged in matrix, an analog processing circuit Analog, the A/D converter circuit ADC which is a digital processing circuit, the column driver CDRV, and the row driver RDRV.

The analog processing circuit Analog executes analog data processing on pieces of imaging data which are analog data output from the pixels PIX_B. Specifically, the analog processing circuit Analog detects a current value corresponding to a difference between pieces of imaging data output from the pixels PIX_B. As a result of the detection, in the case where the current value is different from a reference current value, a trigger signal (represented as TRIG) is generated. The A/D converter circuit ADC, the column driver CDRV, and the row driver RDRV have the same configurations as those described with reference to FIG. 2.

Next, operations of the imaging device including the pixels PIX_B in FIG. 3A are described with reference to FIG. 6 and FIGS. 7A1 to 7C.

First, an operation of a first mode is described (see FIG. 6). In the first mode, comparison of a current value corresponding to the difference in imaging data with a reference current value is performed in the analog processing circuit Analog, whereby the presence or absence of a difference between the first imaging data and the second imaging data which are taken by the pixel PIX_B is detected. As a result of the analog processing, when there is no difference between the first imaging data and the second imaging data, i.e., when a trigger signal is not generated, the analog processing continues. In contrast, when there is a difference between the first imaging data and the second imaging data as a result of the analog processing, i.e., a trigger signal is generated, the mode is switched to a second mode.

For example, in the case where both the first imaging data and the second imaging data are data of an image of a clump of trees (see FIGS. 7A1 and 7A2), the difference therebetween is zero. Thus, a trigger signal is not generated. In contrast, in the case where the first imaging data is data of an image of a clump of trees (see FIG. 7B1) and the second imaging data is data of an image of a clump of trees and a person (see FIG. 7B2), the difference therebetween is not zero, and a trigger signal is generated accordingly. In response to the generation of the trigger signal, the mode of the imaging device is switched from the first mode to the second mode. Note that in the drawings, the first imaging data and the second imaging data show the same scenery but differ in time of taking the image. Therefore, the first imaging data may be represented as imaging data in a first state, and the second imaging data may be represented as imaging data in a second state.

Then, an operation of the second mode is described (see FIG. 6). In the second mode, third imaging data taken by the pixel PIX_B is converted into digital data by A/D conversion. For example, in the case where the third imaging data is data of an image of a clump of trees and a person (see FIG. 7C), the third imaging data is converted into digital data and details of the data are analyzed, whereby detailed information on the person in the data can be obtained. Note that for the analysis of the imaging data, digital processing using image processing software of a computer is used.

Next, an operation for switching the mode from the second mode to the first mode is described (see Step 110 in FIG. 6). This is executable by providing conditions in advance. Examples of the conditions include passage of a predetermined period of time and input of a control signal for terminating the digital processing. When the conditions are satisfied, the mode is switched from the second mode to the first mode.

In the imaging device including the pixel PIX_B illustrated in FIG. 3A, in the first mode, digital processing which consumes a vast amount of power, such as A/D conversion, is not performed and only minimum analog processing for generating a trigger signal is performed; therefore, power consumption can be reduced. Furthermore, in the second mode, a cause of generation of a trigger signal, i.e., the difference between the first imaging data and the second imaging data can be checked in detail by digital processing.

Such a configuration makes it possible to provide an imaging device capable of obtaining highly accurate imaging data. Furthermore, in the imaging device of this embodiment, in the first mode, digital processing which consumes a vast amount of power is not performed and only minimum analog processing for generating a trigger signal is performed; therefore, power consumption can be reduced. Furthermore, in the second mode, a cause of generation of a trigger signal, i.e., the difference between the first imaging data and the second imaging data can be checked in detail by digital processing.

Note that the first imaging data is output from Time t05 to t06 in this embodiment; however, in the case where it is enough to obtain only difference data between the first imaging data and the second imaging data, that is, in the case where the first imaging data need not be output, the operations from Time t03 to Time t06 can be skipped. Note that even in the case where the operations from Time t03 to Time t06 are skipped, when the signal line PR is set at "H", the signal line FR is set at "L", and the signal line TX is set at "H", the potentials of the nodes FN3, FN2, and FN1 are set at VPR, VFR+Δv1, and v1·c2/(c2+c3+cg)+Vth+Δv, respectively, in each of the periods from Time t1 to Time t12, from Time t21 to Time t22, from Time t31 to Time t32, from Time t41 to Time t42, and from Time t51 to Time t52. Note that operations after Time t12 can be explained in a manner similar to those described above.

This embodiment can be implemented in combination with any of the other embodiments as appropriate.

Embodiment 3

Figure 9:
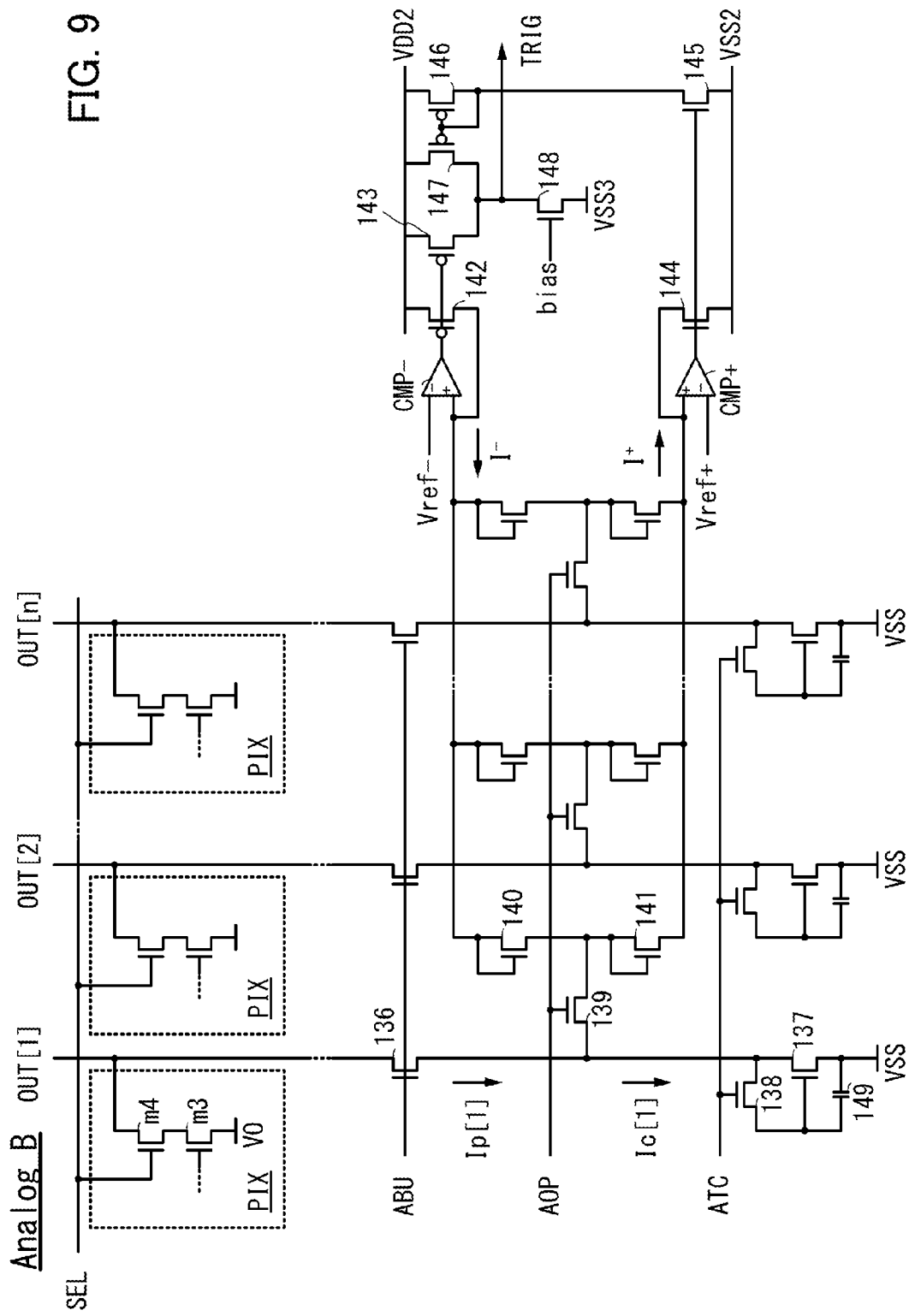
FIG. 9 is a circuit diagram for describing one embodiment of the present invention.

An example of the configuration of the analog processing circuit included in the imaging device described in Embodiment 2 is described with reference to FIG. 8, FIG. 9, and FIG. 10. In this embodiment, two circuit configurations are described as the circuit configuration which can be used for the analog processing circuit.

First, an analog processing circuit Analog_A is described with reference to FIG. 8.

The analog processing circuit Analog_A includes subtraction circuits SUB[1] to SUB[n], absolute value circuits ABS[1] to ABS[n], and an adder circuit SUM.

The subtraction circuits SUB[1] to SUB[n] perform an operation for subtracting the potentials of outputs OUT[1] to OUT[n] of the pixels in the rows from a reference potential VREF. Here, the reference potential VREF is preferably the potential of an output OUT which is obtained when the signal line SEL is set at "H" in the state where the potential of the node FN2 is VFR and the potential of the node FN1 is v1·c2/(c2+c3+cg)+Vth in a dummy circuit having a circuit configuration equivalent to that of the pixel 100, by a driving method similar to that in the period from Time tc1 to Time t01 in FIG. 4. That is, the reference potential VREF is preferably a potential equal to the potential of the output OUT of the pixel in the case where difference data between the first imaging data and the second imaging data is zero. The subtraction circuits SUB[1] to SUB[n] each include an OP amplifier OP0 and resistors R01 to R04. Here, in the subtraction circuit SUB[1], the potential of the signal line OUT[1] and the potential of VREF are represented as V10 and V20, respectively. In addition, the resistance values of the resistors R01 to R04 are set so as to satisfy the following formulae (1) and (2).

$$R01 = R04 \quad (1)$$

$$R04/R01 = R03/R02 \quad (2)$$

Thus, the output of the subtraction circuit SUB[1] satisfies the following formula (3).

$$V0 = V20 - V10 \quad (3)$$

Note that the same applies to the outputs of the subtraction circuits SUB[2] to SUB[n].

The absolute value circuits ABS[1] to ABS[n] output the absolute values of the outputs of the subtraction circuits SUB[1] to SUB[n], respectively. The absolute value circuits ABS[1] to ABS[n] each include an OP amplifier OP11, an OP amplifier OP12, resistors R11 to R15, a diode D11, and a diode D12. Here, in the absolute value circuit ABS[1], the potential of an input signal is represented as V10', and the resistance values are set so that R11=R12 and R13×2=R14=R15, whereby the output of the absolute value circuit ABS[1] (V0') is equal to |V10'|.

Note that the same applies to the outputs of the absolute value circuit ABS[2] to ABS[n].

The adder circuit SUM outputs the sum of the outputs of the absolute value circuits ABS[1] to ABS[n]. The adder circuit SUM includes an OP amplifier OP21, an OP amplifier OP22, resistors R21 to R2n, and resistors R31 to R33. Here, when the potentials of the outputs of the absolute value circuits ABS[1] to ABS[n] are represented as V10" to Vn0", respectively, and the resistance values are set so that R21= . . . =R2n=R31 and R32=R33, the output of the adder circuit SUM (V0") is equal to V10"+ . . . +Vn0". In the case where V0" is regarded as a trigger signal TRIG, when the first imaging data is the same as the second imaging data, TRIG=0. In contrast, when the first imaging data is different from the second imaging data, TRIG=1.

Next, an analog processing circuit Analog_B is described with reference to FIG. 9.

The analog processing circuit includes transistors 136, 137, 138, 139, 140, 141, 142, 143, 144, 145, 146, 147, and 148, a capacitor 149, a comparator CMP+, and a comparator CMP−. The potential of a reference potential line Vref+ and the potential of a reference potential line Vref− are set appropriately.

Figure 10:
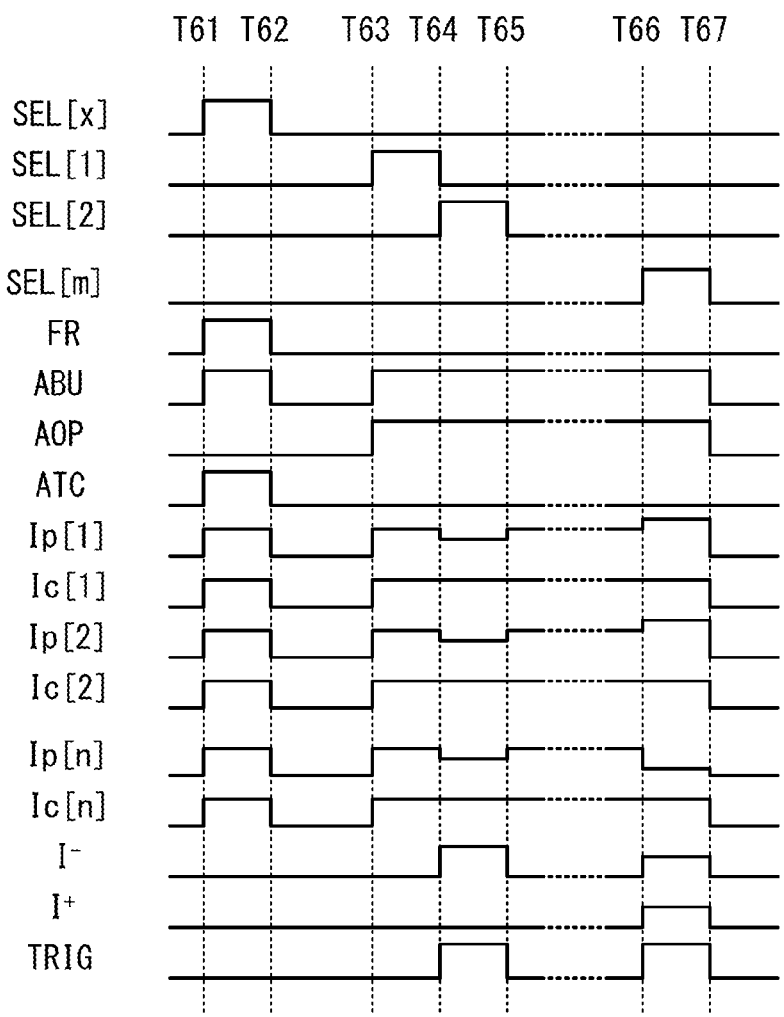
FIG. 10 is a timing chart for describing one embodiment of the present invention.

FIG. 10 is a timing chart showing operations of the analog processing circuit Analog_B.

From Time T61 to Time T62, a signal line ABU is set at "H", a signal line AOP is set at "L", and a signal line ATC is set at "H". Furthermore, the signal line FR and a signal line SEL[x] are set at "H". Note that the signal line SEL[x] is the signal line SEL in an arbitrary row (the x-th row, x is a natural number less than or equal to m). Furthermore, a driving method similar to that in the period from Time tc1 to Time t01 in FIG. 4 is carried out in all the pixels in advance, whereby the potential of the node FN2 in the pixel in each column is VFR and the potential of the node FN1 is v1·c2/(c2+c3+cg)+Vth. At this time a current supplied to the signal lines OUT[1] to OUT[n] in the respective columns is equal to a current value at the time when the gate potential of the transistor m3 (the potential of the node FN1) in each pixel PIX in the x-th row is v1·c2/(c2+c3+cg)+Vth, i.e., a current value I0 at the time when the difference between imaging data in an initial frame and imaging data in a current frame is zero. The current value I0 may be a reference current value. Although the current value I0 corresponding to the reference current value of each column are not always equal, each value does not directly affect the operation of the analog processing circuit as shown below. Accordingly, the reference current value of each column is written as a current value I0. Note that, in the following description, a current corresponding to difference data of each column is explained as a current value ΔI, for easy understanding.

The current values of currents Ip[1] to Ip[n] flowing through the transistors 136 are equal to the current value I0, and the current values of currents Ic[1] to Ic[n] are also equal to the current value I0. Furthermore, the current value of a current flowing in the transistor 137 in which the drain and the gate are connected to each other through the transistor 138 is equal to the current value I0. In particular, a potential charged in the capacitor 149 is set to a potential corresponding to a gate voltage which is necessary for a current with the current value I0 to flow.

From Time T63 to Time T64, the signal line ABU is set at "H", the signal line AOP is set at "H", the signal line ATC is set at "L", and the signal line SEL[1] is set at "H". In the period, a current corresponding to difference data of each pixel in the first row is supplied to the signal lines OUT[1] to OUT[n] in the respective columns Here, when the difference data of each pixel in the first row is zero, the current value of the current supplied to the signal lines OUT[1] to OUT[n] in the respective columns, the current values of the currents Ip[1] to Ip[n] flowing through the transistors 136, and the current values of the currents Ic[1] to Ic[n] are each equal to the current value I0.

From Time T64 to Time T65, the signal line ABU is set at "H", the signal line AOP is set at "H", the signal line ATC is set at "L", and the signal line SEL[2] is set at "H". In the period, a current corresponding to difference data of each pixel in the second row is supplied to the signal lines OUT[1] to OUT[n] in the respective columns. Here, when the difference data of each pixel in the second row is finite (negative) and the current values of the currents supplied to the signal lines OUT[1] to OUT[n] in the respective columns are represented as (I0−ΔI), the current values of the currents Ip[1] to Ip[n] flowing through the transistors 136 are equal to (I0−ΔI), and the current values of the currents Ic[1] to Ic[n] are equal to I0; therefore, a current with a current value ΔI flows through the transistor 139 and the transistor 140.

Here, in order that the current with the current value ΔI flows in the transistor 140 in each column, a current with a current value I$^-$=n·ΔI corresponding to the sum of the currents with the current values ΔI needs to be supplied. Here, owing to the comparator CMP− and the transistor 142, the current I$^-$ is supplied. Here, in the case where the current I$^-$ supplied to the transistor 140 in each column through the transistor 142 is smaller (larger) than n·ΔI, the potential of a + terminal of the comparator CMP− decreases (increases), and thus, the output of the comparator decreases (increases). That is, the gate voltage of the transistor 142 decreases (increases); as a result, it becomes possible to supply a larger (smaller) current I$^-$.

Furthermore, since a potential which is equal to the potential of the gate of the transistor 142 is applied to the transistor 143, a current n1·I$^-$ obtained by multiplying the current I$^-$ by n1, the W/L ratio of the transistor 143 to the transistor 142, flows in the transistor 143. Furthermore, owing to a buffer formed using the transistor 148 and the transistor 143, the signal TRIG is set at "H". Note that a bias voltage bias is applied to the gate of the transistor 148. The bias voltage bias can be set as appropriate.

From Time T66 to Time T67, the signal line ABU is set at "H", the signal line AOP is set at "H", the signal line ATC is set at "L", and the signal line SEL[m] is set at "H". In the period, a current corresponding to difference data of each pixel in the m-th row is supplied to the signal lines OUT[1] to OUT[n] in the respective columns. Here, when the difference data of each pixel in the m-th row is finite (positive) in the first column, finite (positive) in the second column, finite (negative) in the n-th column, and zero in other columns, and the current values of the currents supplied to the signal lines OUT[1], OUT[2], and OUT[n] in the respective columns are represented as (I0+ΔI$_1$), (I0+ΔI$_2$), and (I0−ΔI$_n$), respectively, the current values of the currents Ip[1], Ip[2], and Ip[n] flowing through the transistors 136 are equal to (I0+ΔI$_1$), (I0+ΔI$_2$), and (I0−I$_n$), respectively, and the current values of the currents Ic[1] to Ic[n] are equal to I0. As a result, currents with current values ΔI$_1$ and ΔI$_2$ flow through the transistors 139 and the transistors 140 in the first and second columns, and a current with a current value ΔI$_n$ flows through the transistor 139 and the transistor 141 in the n-th column.

Here, in order that the currents with the currents values ΔI$_1$ and ΔI$_2$ flow in the transistors 140 in the first and second columns, a current with a current value I$^{31}$=ΔI$_1$+ΔI$_2$ corresponding to the sum of the currents with the current values ΔI$_1$ and ΔI$_2$ needs to be supplied. Here, owing to the comparator CMP− and the transistor 142, the current I$^-$ is supplied. Here, in the case where the current I$^-$ supplied to the transistor 140 in each column through the transistor 142 is smaller (larger) than ΔI$_1$+ΔI$_2$, the potential of the + terminal of the comparator CMP− decreases (increases), and thus, the output of the comparator CMP− decreases (increases). That is, the gate voltage of the transistor 142 decreases (increases); as a result, it becomes possible to supply a larger (smaller) current I$^-$.

Here, in order that the current with the current value ΔI$_n$ flows in the transistor 141 in the n-th column, a current with a current value I$^+$=ΔI$_n$ needs to be supplied. Here, owing to the comparator CMP− and the transistor 144, the current I$^+$ can flow. In the case where the current I$^+$ that can flow from the transistor 141 in the n-th column to the transistor 144 is smaller (larger) than ΔI$_n$, the potential of a + terminal of the comparator CMP+ increases (decreases), and thus, the output of the comparator increases (decreases). That is, the gate voltage of the transistor 144 increases (decreases); as a result, it becomes possible that a larger (smaller) current I$^+$ flows.

Furthermore, since a potential which is equal to the potential of the gate of the transistor 142 is applied to the transistor 143, the current n1·I$^-$ obtained by multiplying the current I$^-$ by n1, the W/L ratio of the transistor 143 to the transistor 142 flows in the transistor 143.

Furthermore, since a potential which is equal to the potential of the gate of the transistor 144 is applied to the transistor 145, a current n2·I$^+$ obtained by multiplying the current I$^+$ by n2, the W/L ratio of the transistor 145 to the transistor 144 flows in the transistor 145. The current flowing in the transistor 145 also flows in the transistor 146, and a current n3·n2·I$^+$ obtained by multiplying by n3, the W/L ratio of the transistor 147 to the transistor 146 flows in the transistor 147. Owing to a buffer formed using the transistor 148, the transistor 143, and the transistor 147, the signal TRIG is set at "H".

The above configuration makes it possible to provide an imaging device that consumes less power and is capable of detecting differences with high accuracy.

This embodiment can be implemented in combination with any of the other embodiments as appropriate.

Embodiment 4

In this embodiment, a modified example of the pixel described in the above embodiment is described.

Figure 11A:
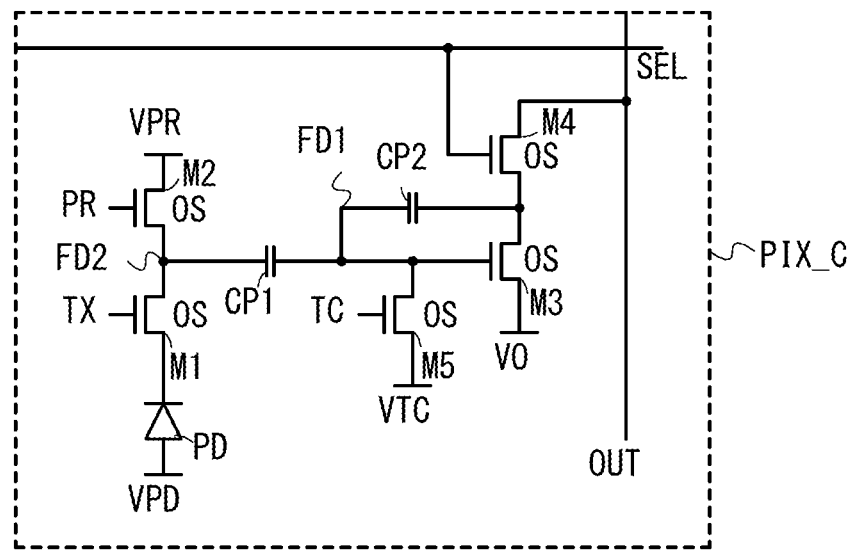
FIGS. 11A and 11B are each a circuit diagram illustrating an imaging device.

FIG. 11A illustrates a modification example of the circuit diagram in FIG. 1A in which the semiconductor layers of the transistors are each formed using an oxide semiconductor. In a pixel PIX_C in FIG. 11A, the transistors M1 to M5 each include an oxide semiconductor in the semiconductor layer.

Note that "OS" is written beside each circuit symbol of the transistors including an oxide semiconductor (also referred to as OS transistors) in the circuit diagram to clearly demonstrate that the transistors each include an oxide semiconductor in the semiconductor layer.

The OS transistor has a characteristic of extremely low off-state current, which can broaden the dynamic range of imaging. In the circuit in FIG. 11A, an increase in the intensity of light entering the photodiode PD reduces the potential of the node FD1. Since the OS transistor has an extremely low off-state current, a current corresponding to the gate potential can be accurately output even when the gate potential is extremely low. Thus, it is possible to broaden the detection range of illuminance, i.e., the dynamic range.

Since a period during which charge can be retained in the node FD1 can be extremely long owing to the extremely low off-state current characteristics of the OS transistor, a global shutter system can be used without a complicated circuit configuration and operation method, and thus, an image with little distortion can be easily obtained even in the case of a moving object. Furthermore, for the same reason, exposure time (a period for conducting charge accumulation operation) can be long; thus, the imaging device is suitable for imaging even in a low illuminance environment.

The OS transistor has lower temperature dependence of change in electrical characteristics than a Si transistor. Therefore, the OS transistor can be used at an extremely wide range of temperatures. Thus, an imaging device and a semiconductor device which include OS transistors are suitable for use in automobiles, aircrafts, and spacecrafts.

With the configuration illustrated in FIG. 11A, the pixel can be formed using a photodiode including silicon and OS transistors. Such a configuration facilitates an increase in the effective area of the photodiode because a Si transistor need not be formed in the pixel. Thus, the imaging sensitivity can be improved.

It is effective to form not only the pixel PIX_C but also peripheral circuits such as the analog processing circuit Analog, the A/D converter circuit ADC, the column driver CDRV, and the row driver RDRV, with the use of OS transistors. A configuration in which peripheral circuits are formed using only OS transistors does not need a process for forming Si transistors; therefore, the configuration is effective in reducing the cost of the imaging device. Furthermore, a configuration in which peripheral circuits are formed using only OS transistors and p-channel Si transistors does not need a process for forming n-channel Si transistors; therefore, the configuration is effective in reducing the cost of the imaging device. Furthermore, since the peripheral circuits can be CMOS circuits, such a configuration is effective in reducing the power consumption of the peripheral circuits, that is, reducing the power consumption of the imaging device.

Figure 11B:
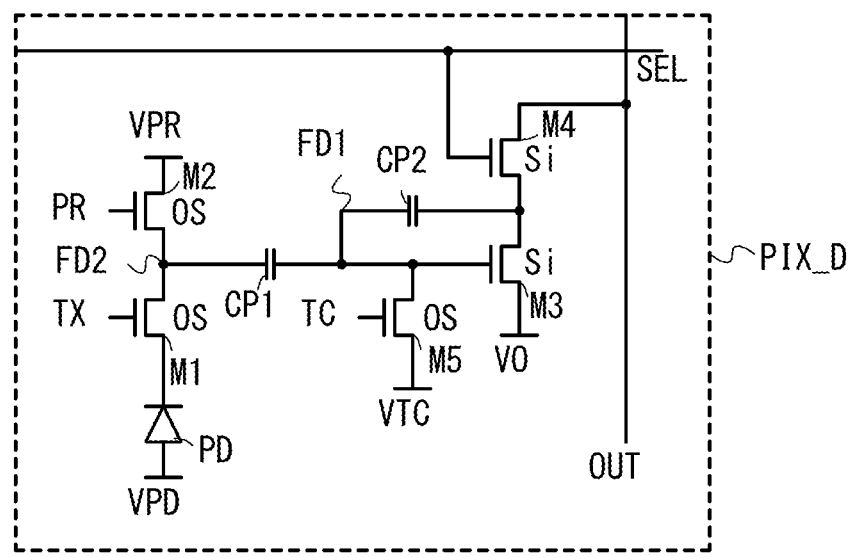

FIG. 11B is a circuit diagram of a pixel PIX_D, which is a modification example of the circuit diagram of FIG. 11A. In the pixel PIX_D in FIG. 11B, the transistors m3 and m4 each include silicon in the semiconductor layer.

Note that "Si" is written beside each circuit symbol of the transistors including silicon (also referred to as Si transistors) in the circuit diagram to clearly demonstrate that the transistors each include silicon in the semiconductor layer.

The Si transistor has a characteristic of excellent field-effect mobility as compared to the OS transistor. Therefore, the amount of current flowing in a transistor functioning as an amplifier transistor can be increased. For example, in FIG. 11B, the amount of current flowing in the transistors M3 and M4 can be increased in accordance with charge accumulated in the node FD1.

Figure 12:
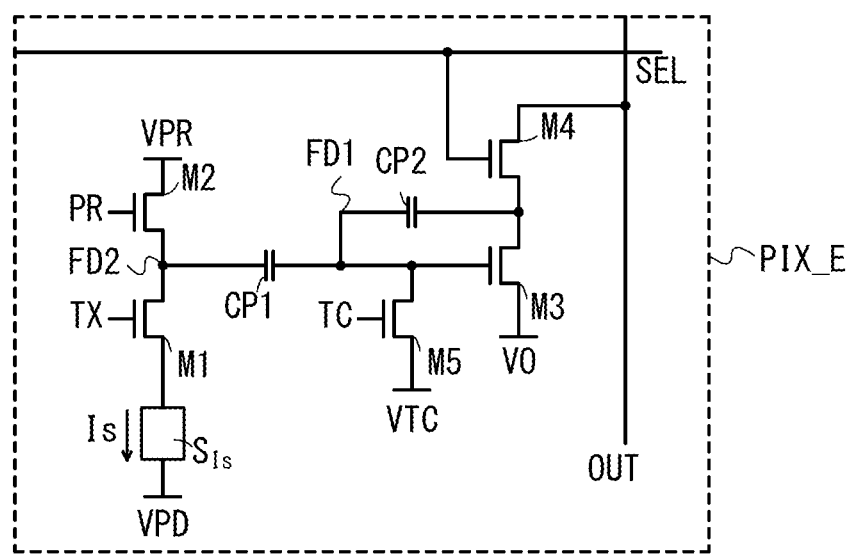
FIG. 12 is a circuit diagram illustrating an imaging device.

FIG. 12 is a circuit diagram of a pixel PIX_E that is the circuit diagram of FIG. 1A in which the photodiode PD is replaced with a sensor $S_{IS}$.

An element which is capable of converting a given physical amount into the amount of current Is flowing in the element may be preferable as the sensor $S_{IS}$. Alternatively, an element which is capable of converting a given physical amount into another physical amount and then converting it into the amount of current flowing in the element may be preferable.

For the sensor $S_{IS}$, a variety of sensors can be used. For example, the sensor $S_{IS}$ can be a temperature sensor, an optical sensor, a gas sensor, a flame sensor, a smoke sensor, a humidity sensor, a pressure sensor, a flow sensor, a vibration sensor, a voice sensor, a magnetic sensor, a radiation sensor, a smell sensor, a pollen sensor, an acceleration sensor, an inclination sensor, a gyro sensor, a direction sensor, or a power sensor.

For example, when an optical sensor is used as the sensor $S_{IS}$, the above-described photodiode or a phototransistor can be used.

When a gas sensor is used as the sensor $S_{IS}$, a semiconductor gas sensor which detects change in resistance due to exposure of a gas to a metal oxide semiconductor such as tin oxide, a catalytic combustion type gas sensor, or a solid electrolyte-type gas sensor can be used.

Figure 22A:
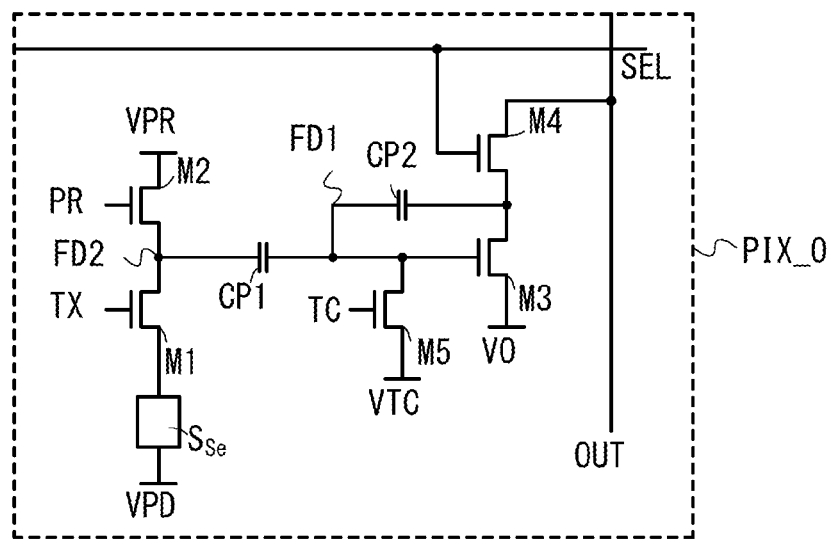
FIG. 22A to FIG. 22C are a circuit diagram and cross-sectional views for describing one embodiment of the present invention.

FIG. 22A is a circuit diagram of a pixel PIX_O in which the photodiode PD of the circuit diagram of FIG. 1A or the sensor $S_{IS}$ of the circuit diagram of FIG. 12 is replaced with a selenium-based semiconductor element $S_{Se}$.

The selenium-based semiconductor element $S_{Se}$ is an element which is capable of conducting photoelectric conversion utilizing a phenomenon called avalanche multiplication, in which a plurality of electrons can be taken from one incident photon by application of voltage. Therefore, in the pixel PIX_O including the selenium-based semiconductor element $S_{Se}$, the gain of electrons to the amount of incident light can be large; therefore, a highly sensitive sensor can be obtained.

For the selenium-based semiconductor element $S_{Se}$, a selenium-based semiconductor including an amorphous structure or a selenium-based semiconductor including a crystalline structure can be used. For example, the selenium-based semiconductor including a crystalline structure may be obtained in such a manner that a selenium-based semiconductor including an amorphous structure is deposited and subjected to heat treatment. Note that it is preferable that the crystal grain diameter of the selenium-based semiconductor including a crystalline structure be smaller than a pixel pitch because variation in characteristics of the pixels is reduced and the image quality of an image to be obtained becomes uniform.

A selenium-based semiconductor including a crystalline structure among the selenium-based semiconductors has a characteristic of having a light absorption coefficient in a wide wavelength range. Therefore, the element using selenium-based semiconductor including a crystalline structure can be used as an imaging element for light in a wide wavelength range, such as visible light, ultraviolet light, X-rays, and gamma rays, and can be used as what is called a direct conversion element, which is capable of directly converting light in a short wavelength range, such as X-rays and gamma rays, into electric charge.

Figure 22B:
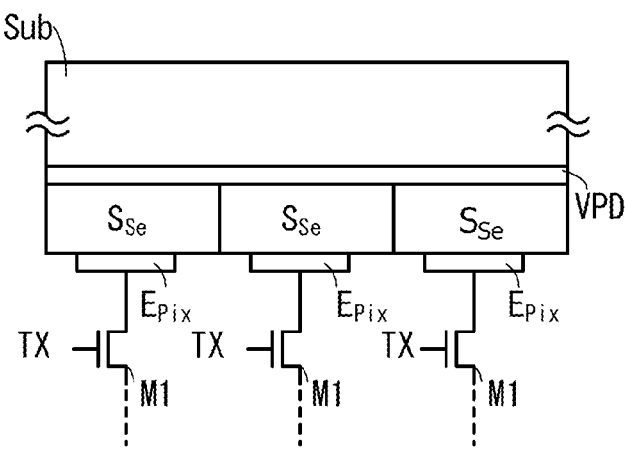

FIG. 22B is a cross-sectional schematic view corresponding to part of the circuit configuration of FIG. 22A. FIG. 22B illustrates the transistors M1, electrodes $E_{pix}$ connected to the transistors M1, the selenium-based semiconductor elements $S_{Se}$, an electrode $E_{VPD}$, and a substrate Sub.

Light is emitted from the side where the electrode $E_{VPD}$ and the substrate Sub are formed toward the selenium-based semiconductor elements $S_{Se}$. Therefore, the electrode $E_{VPD}$ and the substrate Sub preferably transmit light. Indium tin oxide (ITO) can be used for the electrode $E_{VPD}$, and a glass substrate can be used as the substrate Sub.

The selenium-based semiconductor elements $S_{Se}$ and the electrodes $E_{VPD}$ stacked over the selenium-based semiconductor elements $S_{Se}$ can be used without being processed in their shapes in accordance with each pixel. A step for processing the shape can be omitted, leading to a reduction in the manufacturing cost and improvement in the manufacturing yield.

For example, a chalcopyrite-based semiconductor can be used for the selenium-based semiconductor. Specifically, $CuIn_{1-x}GA_xSe_2$ ($0 \leq x \leq 1$, abbreviated to CIGS) can be used, for example. CIGS can be formed by an evaporation method, a sputtering method, or the like.

The selenium-based semiconductor that is a chalcopyrite-based semiconductor can perform avalanche multiplication by being applied with a voltage of several volts (from 5 V to 20 V). By application of voltage to the selenium-based semiconductor, the movement of signal charge generated owing to light irradiation can have high linearity. Note that when the thickness of the selenium-based semiconductor is smaller than or equal to 1 μm, the application voltage can be made smaller.

Note that in the case where the thickness of the selenium-based semiconductor is small, dark current flows at the time of application of voltage; however, providing a layer for inhibiting the dark current from flowing in the CIGS that is a chalcopyrite-based semiconductor (hole-injection barrier layer) can prevent the dark current from flowing. An oxide semiconductor such as gallium oxide can be used for the hole-injection barrier layer. The thickness of the hole-injection barrier layer is preferably smaller than that of the selenium-based semiconductor.

Figure 22C:
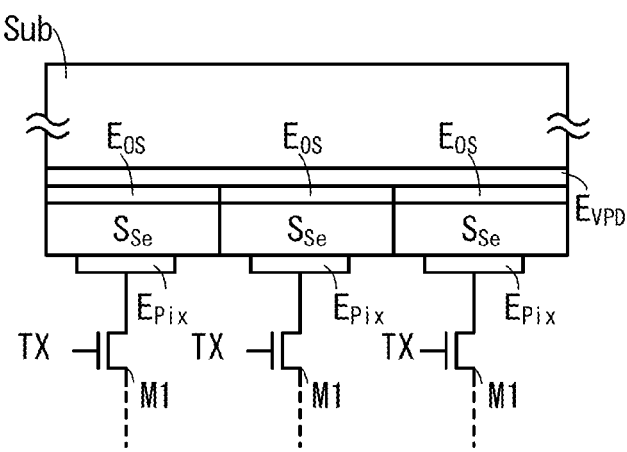

FIG. 22C is a schematic cross-sectional view different from that of FIG. 22B. FIG. 22C shows hole-injection barrier layers $E_{OS}$ together with the transistors M1, the electrodes $E_{Pix}$ connected to the transistors M1, the selenium-based semiconductor elements $S_{Se}$, the electrode $E_{VPD}$, and the substrate Sub.

As described above, use of the selenium-based semiconductor element $S_{Se}$ as a sensor can reduce the manufacturing cost and characteristic variation among pixels and improves the manufacturing yield; as a result, a highly sensitive sensor can be obtained. Thus, a combination with the circuit configuration of one embodiment of the present invention, in which variation in the threshold voltage among the amplifier transistors of the pixels is corrected, enables the imaging device to obtain further highly accurate imaging data.

This embodiment can be implemented in combination with any of the other embodiments as appropriate.

Embodiment 5

In this embodiment, a cross-sectional structure of elements included in an imaging device is described with reference to drawings. A cross section of the structure described in FIG. 11B in Embodiment 4, in which a pixel is formed using the Si transistors and the OS transistors, is described in this embodiment as an example.

Figure 13A:
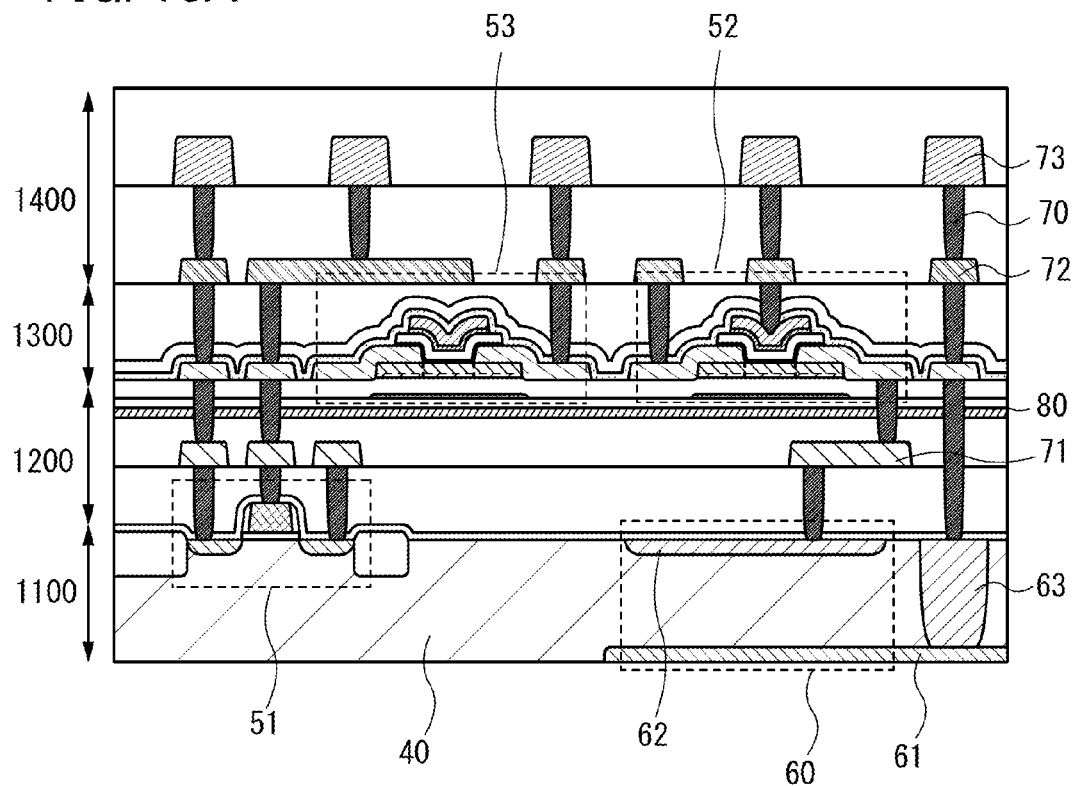
FIGS. 13A and 13B are each a cross-sectional view illustrating an imaging device.
Figure 13B:
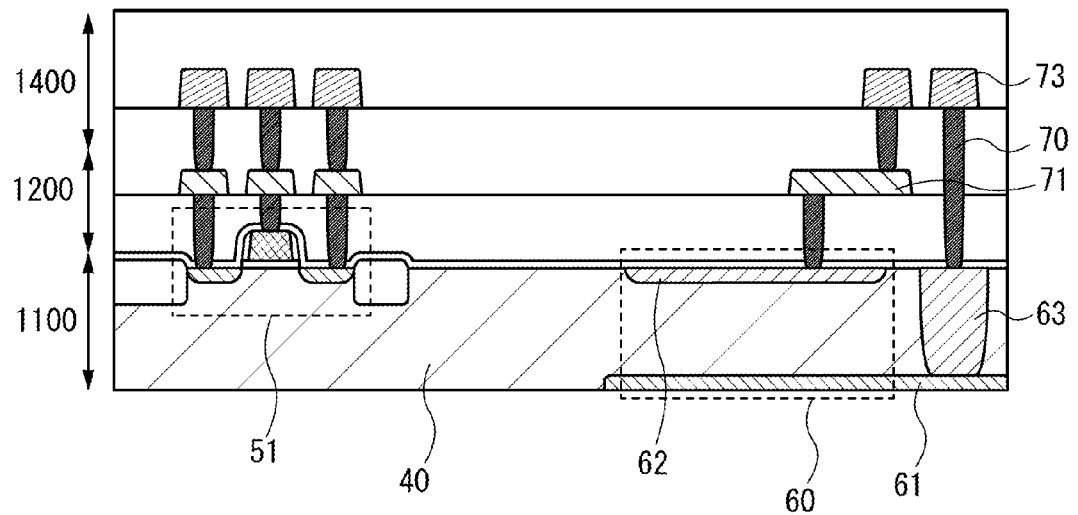

FIGS. 13A and 13B are cross-sectional views of elements included in an imaging device. The imaging device in FIG. 13A includes a Si transistor 51 provided on a silicon substrate 40, OS transistors 52 and 53 stacked over the Si transistor 51, and a photodiode 60 provided in the silicon substrate 40. The transistors and the photodiode 60 are electrically connected to contact plugs 70 and wiring layers 71. In addition, an anode 61 of the photodiode 60 is electrically connected to the contact plug 70 through a low-resistance region 63.

The imaging device includes a layer 1100 including the Si transistor 51 provided on the silicon substrate 40 and the photodiode 60 provided in the silicon substrate 40, a layer 1200 which is in contact with the layer 1100 and includes the wiring layers 71, a layer 1300 which is in contact with the layer 1200 and includes the OS transistors 52 and 53, and a layer 1400 which is in contact with the layer 1300 and includes wiring layers 72 and wiring layers 73.

In the example of the cross-sectional view in FIG. 13A, a surface of the silicon substrate 40 opposite to a surface where the Si transistor 51 is formed includes a light-receiving surface of the photodiode 60. With the structure, an optical path can be obtained without the influence by the transistors or wirings, and therefore, a pixel with a high aperture ratio can be formed. Note that the light-receiving surface of the photodiode 60 can be the same as the surface where the Si transistor 51 is formed.

Note that in the case where the pixel is formed using the OS transistors described in FIG. 11A in Embodiment 4, a layer including the OS transistors may be used as the layer 1100. Alternatively, a structure in which the layer 1100 is not provided and the pixel is formed using only OS transistors may be employed.

In the case where a pixel is formed with use of Si transistors, the layer 1300 may be omitted. An example of a cross-sectional view in which the layer 1300 is not provided is shown in FIG. 13B.

Note that the silicon substrate 40 is not limited to a bulk silicon substrate and may be an SOI substrate. Furthermore, the silicon substrate 40 can be replaced with a substrate made of germanium, silicon germanium, silicon carbide, gallium arsenide, aluminum gallium arsenide, indium phosphide, gallium nitride, or an organic semiconductor.

An insulating layer 80 is provided between the layer 1100 including the Si transistor 51 and the photodiode 60 and the layer 1300 including the OS transistors 52 and 53 although there is no limitation on its specific position.

Hydrogen in an insulating layer provided in the vicinity of the active region of the Si transistor 51 terminates dangling bonds of silicon; accordingly, the reliability of the Si transistor 51 can be improved. Meanwhile, hydrogen in insulating layers provided in the vicinities of the oxide semiconductor layers, which are the active layers, of the OS transistors 52 and 53 provided in an upper portion becomes a factor of generating carriers in the oxide semiconductor; thus, the reliability of the OS transistors 52 and 53 might be decreased. Therefore, in the case where the transistor using an oxide semiconductor is provided over the transistor using a silicon-based semiconductor material, it is preferable that the insulating layer 80 having a function of preventing diffusion of hydrogen be provided between the transistors. The insulating layer 80 makes hydrogen remain in the lower portion, thereby improving the reliability of the Si transistor 51. In addition, since the insulating layer 80 prevents diffusion of hydrogen from the lower portion to the upper portion, the reliability of the OS transistors 52 and 53 also can be improved.

The insulating layer 80 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

In the cross-sectional view of FIG. 13A, the photodiode 60 provided in the layer 1100 and the transistors provided in the layer 1300 can be formed to overlap each other. This structure can increase the degree of integration of pixels. In other words, the resolution of the imaging device can be increased.

This embodiment can be implemented in combination with any of the other embodiments as appropriate.

Embodiment 6

In this embodiment, a cross-sectional structure of an example of an image device including a color filter and the like is described with reference to drawings.

Figure 14A:
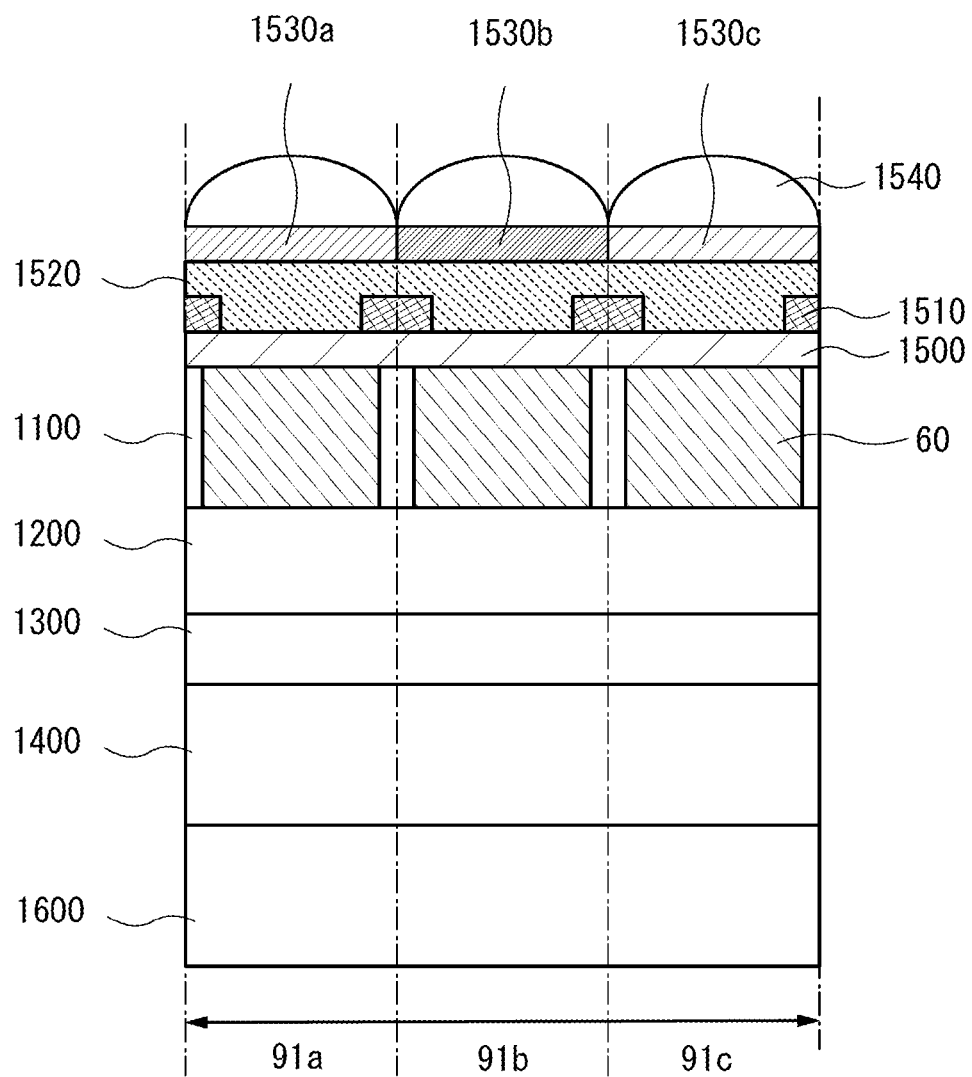
FIGS. 14A and 14B are each a cross-sectional view illustrating an imaging device.

FIG. 14A is a cross-sectional view of an example of a mode in which a color filter and the like are added to the imaging device in FIGS. 13A and 13B, illustrating a region occupied by circuits (circuits 91a, 91b, and 91c) corresponding to three pixels. An insulating layer 1500 is formed over the photodiode 60 provided in the layer 1100. As the insulating layer 1500, for example, a silicon oxide film with a high visible-light transmitting property can be used. In addition, a silicon nitride film may be stacked as a passivation film. In addition, a dielectric film of hafnium oxide or the like may be stacked as an anti-reflection film.

A light-blocking layer 1510 is formed over the insulating layer 1500. The light-blocking layer 1510 has a function of inhibiting color mixing of light passing through the color filter. The light-blocking layer 1510 can be formed of a metal layer of aluminum, tungsten, or the like, or a stack including the metal layer and a dielectric film functioning as an anti-reflection film.

An organic resin layer 1520 is formed as a planarization film over the insulating layer 1500 and the light-blocking layer 1510. A color filter 1530a, a color filter 1530b, and a color filter 1530c are formed over the circuit 91a, the circuit 91b, and the circuit 91c to be paired up with the circuit 91a, the circuit 91b, and the circuit 91c, respectively. The color filter 1530a, the color filter 1530b, and the color filter 1530c have colors of R (red), G (green), and B (blue), whereby a color image can be obtained.

A microlens array 1540 is provided over the color filters 1530a, 1530b, and 1530c so that light passing through a lens further passes through the color filter positioned under the lens to reach the photodiode.

A supporting substrate 1600 is provided in contact with the layer 1400. As the supporting substrate 1600, a hard substrate such as a semiconductor substrate (e.g., a silicon substrate), a glass substrate, a metal substrate, or a ceramic substrate can be used. Note that an inorganic insulating layer or an organic resin layer as an adhering layer may be between the layer 1400 and the supporting substrate 1600.

Figure 14B:
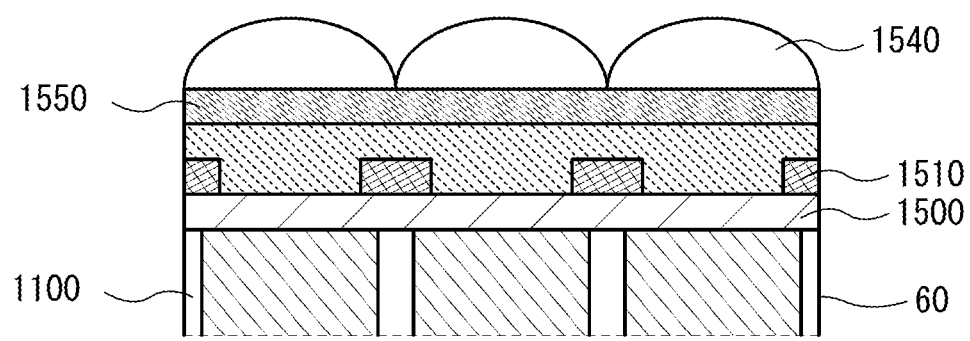

In the structure of the imaging device, an optical conversion layer 1550 may be used instead of the color filters 1530a, 1530b, and 1530c (see FIG. 14B). When the optical conversion layer 1550 is used instead, the imaging device can capture images in various wavelength regions.

For example, when a filter which blocks light having a wavelength shorter than or equal to that of visible light is used as the optical conversion layer 1550, an infrared imaging device can be obtained. When a filter which blocks light having a wavelength shorter than or equal to that of near infrared light is used as the optical conversion layer 1550, a far-infrared imaging device can be obtained. When a filter which blocks light having a wavelength longer than or equal to that of visible light is used as the optical conversion layer 1550, an ultraviolet imaging device can be obtained.

Furthermore, when a scintillator is used as the optical conversion layer 1550, an imaging device which captures an image visualizing the intensity of radiation, such as a medical X-ray imaging device, can be obtained. Radiation such as X-rays passes through a subject to enter a scintillator, and then is converted into light (fluorescence) such as visible light or ultraviolet light owing to a phenomenon known as photoluminescence. Then, the photodiode 60 detects the light to obtain image data.

The scintillator is formed of a substance that, when irradiated with radial rays such as X-rays or gamma-rays, absorbs energy of the radial rays to emit visible light or ultraviolet light or a material containing the substance. For example, materials such as $Gd_2O_2S{:}Tb$, $Gd_2O_2S{:}Pr$, $Gd_2O_2S{:}Eu$, $BaFCl{:}Eu$, $NaI$, $CsI$, $CaF_2$, $BaF_2$, $CeF_3$, $LiF$, $LiI$, and $ZnO$ and a resin or ceramics in which any of the materials is dispersed are known.

This embodiment can be implemented in an appropriate combination with any of the structures described in the other embodiments.

Embodiment 7

In this embodiment, an application of the OS transistor described in the embodiment is described.

The off-state current of an OS transistor can be reduced by reducing the concentration of impurities in an oxide semiconductor to make the oxide semiconductor intrinsic or substantially intrinsic. The term "substantially intrinsic" refers to a state where an oxide semiconductor has a carrier density lower than $1 \times 10^{17}/cm^3$, preferably lower than $1 \times 10^{15}/cm^3$, further preferably lower than $1 \times 10^{13}/cm^3$. In the oxide semiconductor, hydrogen, nitrogen, carbon, silicon, and a metal element other than a main component are impurities. For example, hydrogen and nitrogen form donor levels to increase the carrier density, and silicon forms impurity levels in the oxide semiconductor layer.

A transistor using an intrinsic or substantially intrinsic oxide semiconductor has a low carrier density and thus is less likely to have negative threshold voltage. In addition, because of few carrier traps in the oxide semiconductor, the transistor including the oxide semiconductor has small variation in electrical characteristics and high reliability. Furthermore, a transistor including the oxide semiconductor enables an extremely low off-state current.

For example, the OS transistor with reduced off-state current can exhibit a normalized off-state current per micrometer in channel width of less than or equal to $1 \times 10^{-18}$ A, preferably less than or equal to $1 \times 10^{-21}$ A, further preferably less than or equal to $1 \times 10^{-24}$ A at room temperature (approximately 25° C.); or less than or equal to $1 \times 10^{-15}$ A, preferably less than or equal to $1 \times 10^{-18}$ A, further preferably less than or equal to $1 \times 10^{-21}$ A at 85° C.

Note that the off-state current of an n-channel transistor refers to a current that flows between a source and a drain when the transistor is off. For example, the off-state current of an n-channel transistor with a threshold voltage of about 0 V to 2 V refers to a current that flows between a source and a drain when a negative voltage is applied between a gate and the source.

Note that at least indium (In) or zinc (Zn) is preferably contained as an oxide semiconductor used for the semiconductor layer of the OS transistor. In particular, In and Zn are preferably contained. A stabilizer for strongly bonding oxygen is preferably contained in addition to In and Zn. As a stabilizer, at least one of gallium (Ga), tin (Sn), zirconium (Zr), hafnium (Hf), and aluminum (Al) may be contained.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As an oxide semiconductor used for the semiconductor layer of the transistor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide with an atomic ratio of In:Ga:Zn=1:1:1, In:Ga:Zn=3:1:2, or In:Ga:Zn=2:1:3, or an oxide with an atomic ratio close to the above atomic ratios can be used.

When the oxide semiconductor film forming the semiconductor layer contains a large amount of hydrogen, the hydrogen and the oxide semiconductor are bonded to each other, so that part of the hydrogen serves as a donor and causes generation of an electron which is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. For this reason, it is preferable that oxygen be added to the oxide semiconductor film to fill oxygen vacancies increased by the dehydration treatment (dehydrogenation treatment).

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) or substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density of lower than or equal to $1 \times 10^{17}/cm^3$, lower than or equal to $1 \times 10^{16}/cm^3$, lower than or equal to $1 \times 10^{15}/cm^3$, lower than or equal to $1 \times 10^{14}/cm^3$, or lower than or equal to $1 \times 10^{13}/cm^3$.

Thus, the transistor including an i-type or substantially i-type oxide semiconductor film can have extremely favorable off-state current characteristics.

This embodiment can be implemented in an appropriate combination with any of the structures described in the other embodiments.

Embodiment 8

In this embodiment, a case where the imaging device described in Embodiment 2 is used for a monitoring device (also referred to as a monitoring system) is described.

Figure 15:
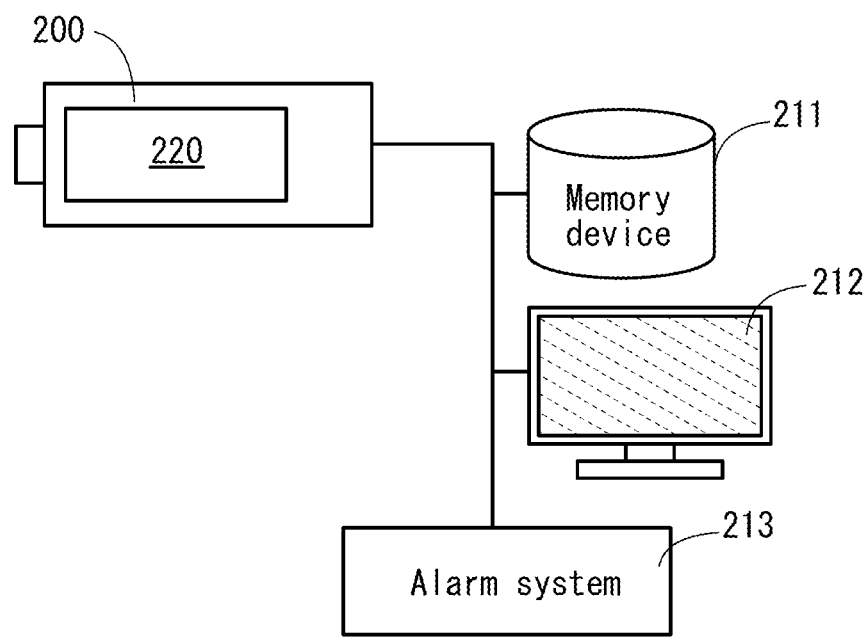
FIG. 15 is a block diagram illustrating an example of a configuration of a monitoring system.

FIG. 15 is a block diagram illustrating the structural example of the monitoring device of this embodiment. The monitoring device includes a camera 200, a memory device 211, a display device 212, and an alarm device 213. The camera 200 includes an imaging device 220. The camera 200, the memory device 211, the display device 212, and the alarm device 213 are functionally connected to one another. An image captured by the camera 200 is stored in the memory device 211 and displayed on the display device 212. The alarm device 213 gives an alarm to an administrator when the camera 200 detects movement.

In the imaging device 220, a trigger signal is generated when the camera 200 detects difference data. Analog processing continues when the trigger signal is not generated, whereas digital processing is performed when the trigger signal is generated. Therefore, it is not necessary to continuously perform digital processing, which consumes a vast amount of power; thus, power consumption can be reduced.

For example, the first state is set to a state where there is surely no intruder entering the monitored area, and the second state is set to the current state. Here, when there is not intruder in the state where the imaging device 220 operates in the first mode, the first imaging data is the same as the second data, and thus difference data is zero. Accordingly, the result of a sum-of-absolute-difference operation performed on the difference data read from each pixel in the analog processing circuit is zero, and no trigger signal is generated. In contrast, when there is an intruder, the first imaging data is different from the second imaging data, and thus, difference data is infinite. Accordingly, the result of a sum-of-absolute-difference operation performed on the difference data read from each pixel in the analog processing circuit is finite, and the trigger signal is generated. The mode of the imaging device 220 is switched to the second mode in response to the generation of the trigger signal, third imaging data is converted into digital data in the digital processing circuit, and detailed analysis of the captured image is executed by digital processing with a personal computer or the like. As a result, detailed information on the intruder can be obtained.

Therefore, in a period in which movement in the image is not detected, the imaging device 220 does not execute digital processing. As a result, the power consumption in the camera 200 can be reduced. Furthermore, since the memory capacity of the memory device 211 can be saved by image data in the period in which no movement is detected, recording for a longer period is possible.

Note that the alarm device 213 may give an alarm to those around the alarm device 213 when the trigger signal is generated. Alternatively, whether or not an alarm is given may be determined on the basis of a result of comparison by a certification system.

This embodiment can be implemented in an appropriate combination with any of the structures described in the other embodiments.

Embodiment 9

In this embodiment, examples of an electronic appliance including the imaging device of one embodiment of the present invention are described.

Examples of an electronic appliance including the imaging device of one embodiment of the present invention are as follows: display devices such as televisions and monitors, lighting devices, desktop personal computers and laptop personal computers, word processors, image reproduction devices which reproduce still images and moving images stored in recording media such as digital versatile discs (DVDs), portable CD players, radios, tape recorders, headphone stereos, stereos, navigation systems, table clocks, wall clocks, cordless phone handsets, transceivers, mobile phones, car phones, portable game consoles, tablet terminals, large game machines such as pinball machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electric power tools such as chain saws, smoke detectors, medical equipment such as dialyzers, facsimiles, printers, multifunction printers, automated teller machines (ATM), and vending machines. Furthermore, industrial equipment such as guide lights, traffic lights, belt conveyors, elevators, escalators, industrial robots, power storage systems, and power storage devices for leveling the amount of power supply and smart grid can be given. In addition, moving objects and the like driven by fuel engines and electric motors using power from non-aqueous secondary batteries are also included in the category of electronic appliances. Examples of the moving objects are electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts.

Figure 16A:
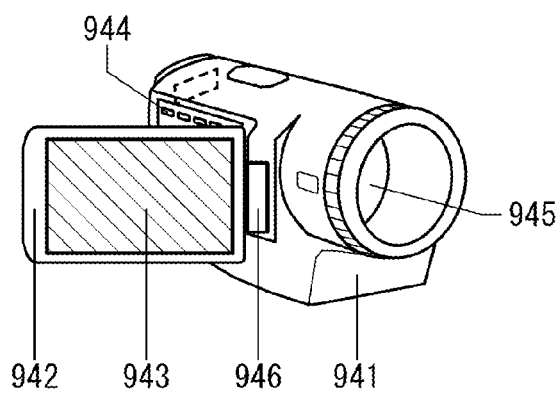
FIGS. 16A to 16F each illustrate an electronic appliance including an imaging device.

FIG. 16A illustrates a video camera including a housing 941, a housing 942, a display portion 943, operation keys 944, a lens 945, a joint 946, and the like. The operation keys 944 and the lens 945 are provided in the housing 941, and the display portion 943 is provided in the housing 942. The housing 941 and the housing 942 are connected to each other with the joint 946, and the angle between the housing 941 and the housing 942 can be changed with the joint 946. Images displayed on the display portion 943 may be switched in accordance with the angle at the joint 946 between the housing 941 and the housing 942. The imaging device of one embodiment of the present invention can be provided in a focus position of the lens 945.

Figure 16B:
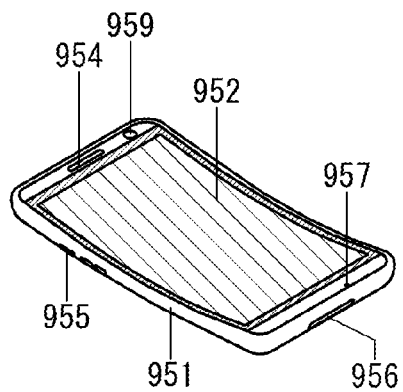

FIG. 16B illustrates a mobile phone which includes a display portion 952, a microphone 957, a speaker 954, a camera 959, an input/output terminal 956, an operation button 955, and the like in a housing 951. The imaging device of one embodiment of the present invention can be used for the camera 959.

Figure 16C:
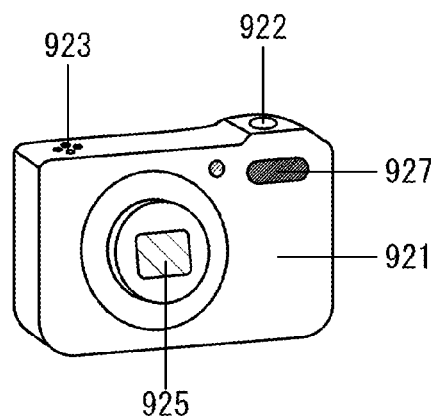

FIG. 16C illustrates a digital camera which includes a housing 921, a shutter button 922, a microphone 923, a light-emitting portion 927, a lens 925, and the like. The imaging device of one embodiment of the present invention can be provided in a focus position of the lens 925.

Figure 16D:
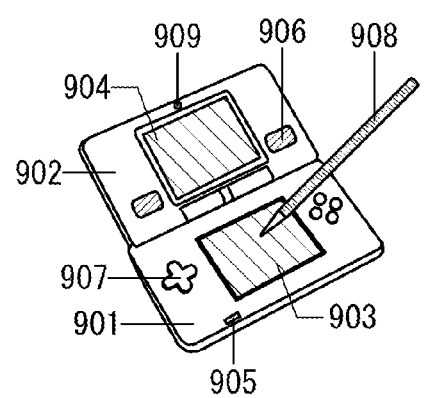

FIG. 16D illustrates a portable game console which includes a housing 901, a housing 902, a display portion 903, a display portion 904, a microphone 905, a speaker 906, an operation key 907, a stylus 908, a camera 909, and the like. Although the portable game console in FIG. 16A has the two display portions 903 and 904, the number of display portions included in a portable game console is not limited to this. The imaging device of one embodiment of the present invention can be used for the camera 909.

Figure 16E:
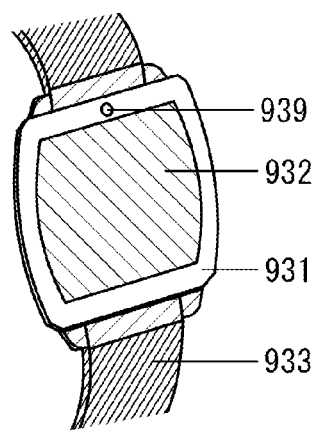

FIG. 16E illustrates a wrist-watch-type information terminal which includes a housing 931, a display portion 932, a wristband 933, a camera 939, and the like. The display portion 932 may be a touch panel. The imaging device of one embodiment of the present invention can be used for the camera 939.

Figure 16F:
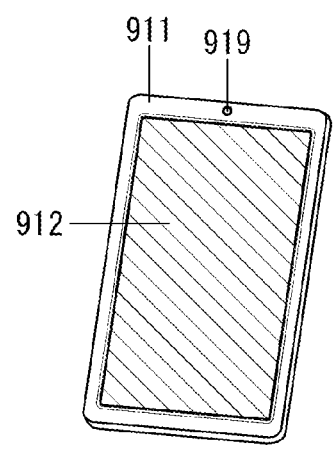

FIG. 16F illustrates a portable data terminal which includes a housing 911, a display portion 912, a camera 919, and the like. A touch panel function of the display portion 912 enables input and output of information. The imaging device of one embodiment of the present invention can be used for the camera 919.

Needless to say, the examples are not limited to the above-described electronic appliances as long as the imaging device of one embodiment of the present invention is included.

This embodiment can be implemented in an appropriate combination with any of the structures described in the other embodiments.

This application is based on Japanese Patent Application serial no. 2014-129826 filed with Japan Patent Office on Jun. 25, 2014, the entire contents of which are hereby incorporated by reference.

What is claimed is:

1. An imaging device comprising a pixel, the pixel comprising:
a photodiode configured to generate photoelectric converted signal charge;
a first transistor;
a second transistor;
a first capacitor;
a second capacitor;
a first wiring configured to supply a low potential;
a second wiring configured to supply a high potential; and
a third wiring configured to supply a high potential,
wherein one electrode of the photodiode is electrically connected to the first wiring,
wherein one electrode of the first capacitor is electrically connected to the other electrode of the photodiode,
wherein the other electrode of the first capacitor is electrically connected to a gate of the first transistor,
wherein one electrode of the second capacitor is electrically connected to the gate of the first transistor,
wherein the other electrode of the second capacitor is electrically connected to one of a source and a drain of the first transistor,
wherein the other of the source and the drain of the first transistor is electrically connected to the second wiring, wherein one of a source and a drain of the second transistor is electrically connected to the gate of the first transistor, and wherein the other of the source and the drain of the second transistor is electrically connected to the third wiring.

2. The imaging device according to claim 1, further comprising a third transistor, wherein one of a source and a drain of the third transistor is electrically connected to the other electrode of the photodiode, wherein the other of the source and the drain of the third transistor is electrically connected to the one electrode of the first capacitor, and wherein the third transistor is configured to supply the signal charge to the one electrode of the first capacitor.

3. The imaging device according to claim 2, wherein the third transistor comprises a semiconductor layer, and wherein the semiconductor layer comprises an oxide semiconductor.

4. The imaging device according to claim 1, further comprising:

a fourth transistor; and a fourth wiring configured to supply a high potential, wherein one of a source and a drain of the fourth transistor is electrically connected to the fourth wiring, wherein the other of the source and the drain of the fourth transistor is electrically connected to the one electrode of the first capacitor, and wherein the fourth transistor is configured to supply a potential of the fourth wiring to the one electrode of the first capacitor.

5. The imaging device according to claim 4, wherein the fourth transistor comprises a semiconductor layer, and wherein the semiconductor layer comprises an oxide semiconductor.

6. The imaging device according to claim 1, wherein the first and second transistors each comprise a semiconductor layer, and wherein the semiconductor layer comprises an oxide semiconductor.

7. The imaging device according to claim 1, wherein the second transistor is configured to make the second capacitor have a threshold voltage of the first transistor by supplying a potential of the third wiring to the one electrode of the second capacitor, and wherein the first capacitor is configured to bring the other electrode of the first capacitor into an electrically floating state in a state where the threshold voltage is retained in the second capacitor, and configured to change a potential of the gate of the first transistor when a potential of the one electrode of the first capacitor is changed in accordance with the signal charge.

8. A monitoring device comprising:

a camera comprising the imaging device according to claim 1;

a display device functionally connected to the camera;

a memory device functionally connected to the camera; and an alarm device functionally connected to the camera.

9. An electronic appliance comprising:

the monitoring device according to claim 8; and an operation key.

10. An imaging device comprising a pixel, the pixel comprising:

a photodiode configured to generate photoelectric converted signal charge;

a first transistor;

a second transistor;

a third transistor;

a first capacitor;

a second capacitor;

a third capacitor;

a first wiring configured to supply a low potential;

a second wiring configured to supply a high potential or a low potential;

a third wiring configured to supply a high potential; and a fourth wiring configured to supply a high potential, wherein one electrode of the photodiode is electrically connected to the first wiring, wherein one electrode of the first capacitor is electrically connected to the other electrode of the photodiode, wherein the other electrode of the first capacitor is electrically connected to one electrode of the second capacitor, wherein one of a source and a drain of the first transistor is electrically connected to the one electrode of the second capacitor, wherein the other of the source and the drain of the first transistor is electrically connected to the second wiring, wherein the other electrode of the second capacitor is electrically connected to a gate of the second transistor, wherein one electrode of the third capacitor is electrically connected to the gate of the second transistor, wherein the other electrode of the third capacitor is electrically connected to one of a source and a drain of the second transistor, wherein the other of the source and the drain of the second transistor is electrically connected to the third wiring, wherein one of a source and a drain of the third transistor is electrically connected to the gate of the second transistor, and wherein the other of the source and the drain of the third transistor is electrically connected to the fourth wiring.

11. The imaging device according to claim 10, further comprising a fourth transistor, wherein one of a source and a drain of the fourth transistor is electrically connected to the other electrode of the photodiode, wherein the other of the source and the drain of the fourth transistor is electrically connected to the one electrode of the first capacitor, and wherein the fourth transistor is configured to supply the signal charge to the one electrode of the first capacitor.

12. The imaging device according to claim 11, wherein the fourth transistor comprises a semiconductor layer, and wherein the semiconductor layer comprises an oxide semiconductor.

13. The imaging device according to claim 10, further comprising:

a fifth transistor; and a fifth wiring configured to supply a high potential, wherein one of a source and a drain of the fifth transistor is electrically connected to the fifth wiring, wherein the other of the source and the drain of the fifth transistor is electrically connected to the one electrode of the first capacitor, and wherein the fifth transistor is configured to supply a potential of the fifth wiring to the one electrode of the first capacitor.

14. The imaging device according to claim 13,
wherein the fifth transistor comprises a semiconductor layer, and
wherein the semiconductor layer comprises an oxide semiconductor.

15. The imaging device according to claim 10,
wherein the first to third transistors each comprise a semiconductor layer, and
wherein the semiconductor layer comprises an oxide semiconductor.

16. The imaging device according to claim 10,
wherein the third transistor is configured to make the third capacitor have a threshold voltage of the second transistor by supplying a potential of the fourth wiring to the one electrode of the third capacitor,
wherein the first capacitor is configured to bring the other electrode of the first capacitor into an electrically floating state and configured to change a potential of the other electrode of the first capacitor when a potential of the one electrode of the first capacitor is changed in accordance with the signal charge, and
wherein the second capacitor is configured to bring the other electrode of the second capacitor into an electrically floating state in a state where the threshold voltage is retained in the third capacitor, and configured to change a potential of the gate of the second transistor when a potential of the one electrode of the second capacitor is changed.

17. A monitoring device comprising:
a camera comprising the imaging device according to claim 10;
a display device functionally connected to the camera;
a memory device functionally connected to the camera; and
an alarm device functionally connected to the camera.

18. An electronic appliance comprising:
the monitoring device according to claim 17; and
an operation key.

* * * * *